United States Patent
Ogura et al.

(10) Patent No.: US 10,340,372 B1
(45) Date of Patent: Jul. 2, 2019

(54) TRANSISTOR DEVICE HAVING A PILLAR STRUCTURE

(71) Applicant: SEMICONDUCTOR COMPONENTS INDUSTRIES, LLC, Phoenix, AZ (US)

(72) Inventors: Takashi Ogura, Oizumi-machi (JP); Mitsuru Soma, Higashimatsuyama (JP); Dean E. Probst, West Jordan, UT (US); Takashi Hiroshima, Ota (JP); Peter A. Burke, Portland, OR (US); Toshimitsu Taniguchi, Aizuwakamatsu (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 15/943,914

(22) Filed: Apr. 3, 2018

Related U.S. Application Data

(60) Provisional application No. 62/608,462, filed on Dec. 20, 2017.

(51) Int. Cl.
| | | |
|---|---|---|
| *H01L 29/739* | (2006.01) | |
| *H01L 29/423* | (2006.01) | |
| *H01L 29/10* | (2006.01) | |
| *H01L 29/78* | (2006.01) | |
| *H01L 29/732* | (2006.01) | |

(52) U.S. Cl.
CPC ......... *H01L 29/7396* (2013.01); *H01L 29/10* (2013.01); *H01L 29/4236* (2013.01); *H01L 29/7325* (2013.01); *H01L 29/78* (2013.01)

(58) Field of Classification Search
CPC . H01L 29/7396; H01L 29/7325; H01L 29/78; H01L 29/4236; H01L 29/10
See application file for complete search history.

(56) References Cited

U.S. PATENT DOCUMENTS

| | | |
|---|---|---|
| 2010/0171173 A1 | 7/2010 | Hsieh |
| 2010/0176446 A1 | 7/2010 | Hsieh |
| 2011/0068389 A1 | 3/2011 | Hsieh |
| 2017/0317207 A1* | 11/2017 | Hsieh .................. H01L 29/7813 |

\* cited by examiner

*Primary Examiner* — John P. Dulka
(74) *Attorney, Agent, or Firm* — Brake Hughes Bellermann LLP

(57) ABSTRACT

In at least one general aspect, an apparatus can include a first trench disposed in a semiconductor region and including a gate electrode, and a second trench disposed in the semiconductor region. The apparatus can include a mesa region disposed between the first trench and the second trench, and a source region of a first conductivity type disposed in a top portion of the mesa region. The apparatus can include an epitaxial layer of the first conductivity type, and a body region of a second conductivity type disposed in the mesa region and disposed between the source region and the epitaxial layer of the first conductivity type. The apparatus can include a pillar of the second conductivity type disposed in the mesa region such that a first portion of the source region is disposed lateral to the pillar and a second portion of the source region is disposed above the pillar.

20 Claims, 22 Drawing Sheets

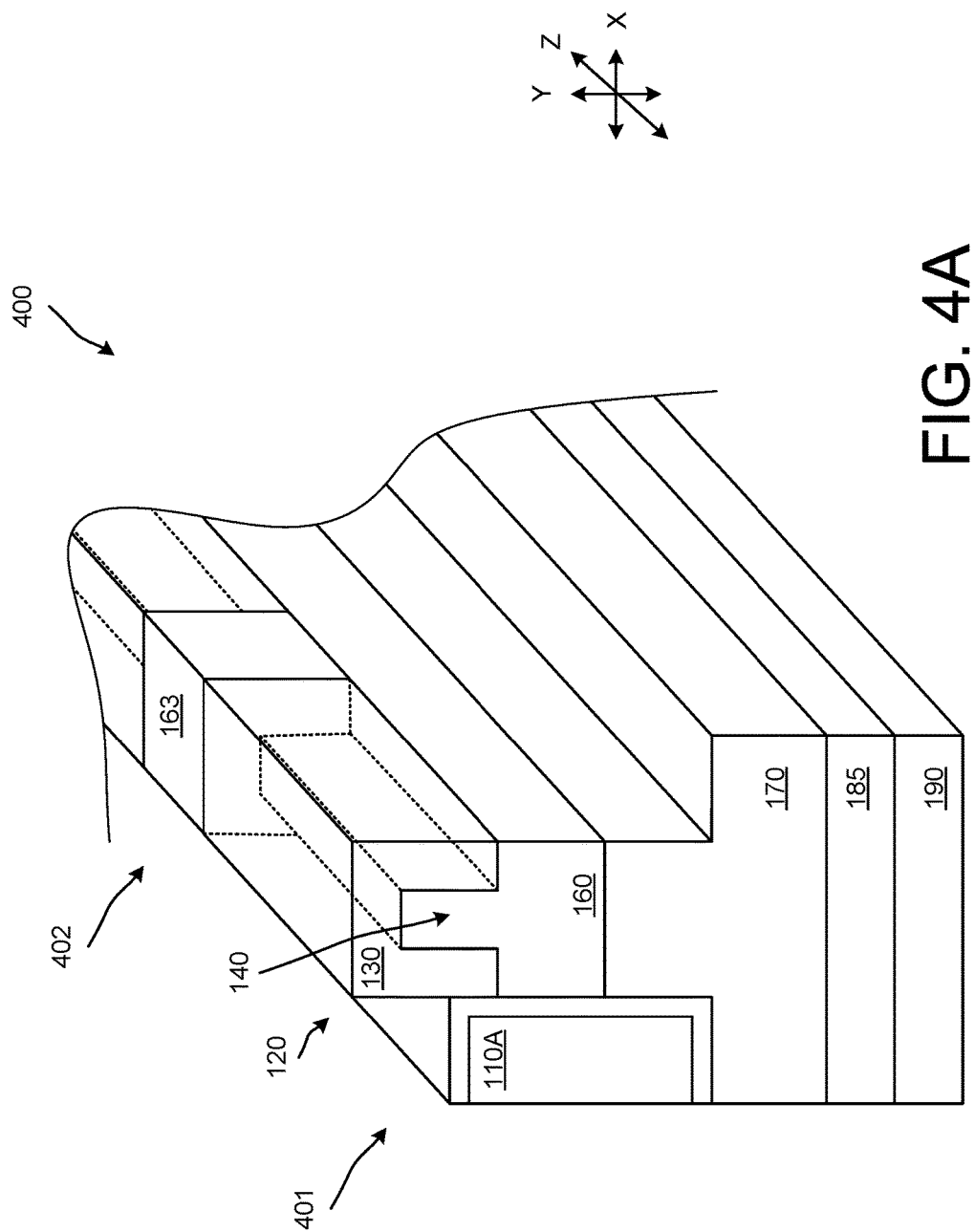

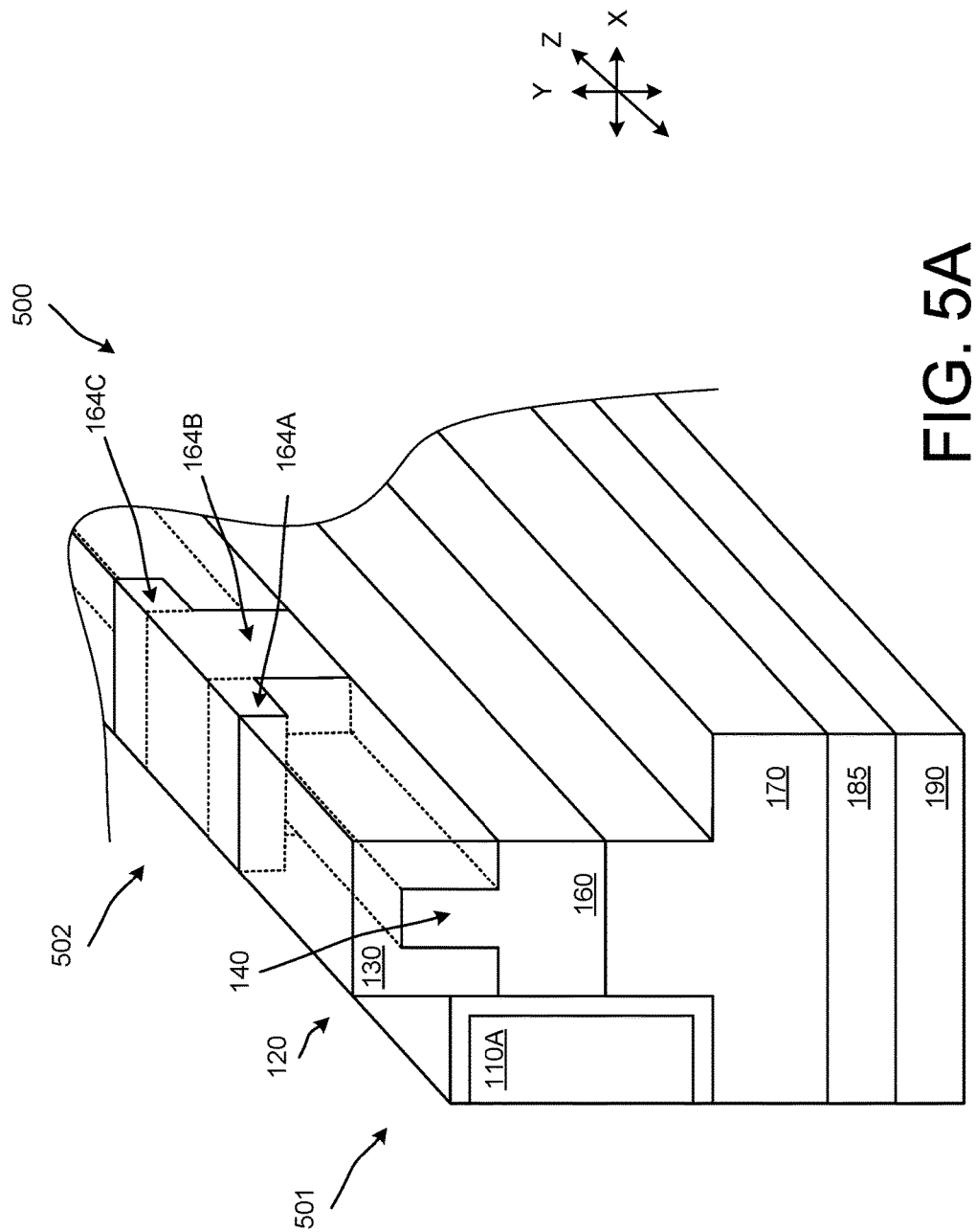

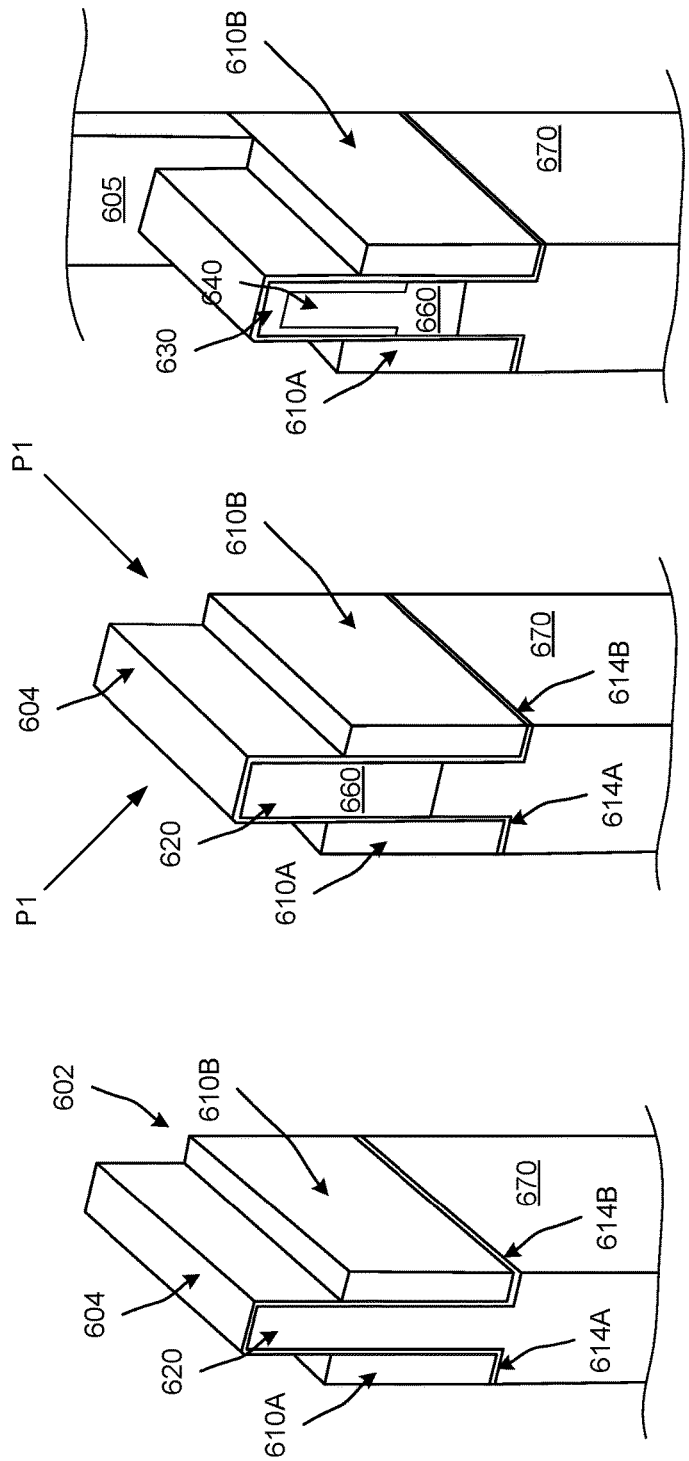

TRANSISTOR DEVICE HAVING A PILLAR STRUCTURE

RELATED APPLICATION

This Application claims priority to and the benefit of U.S. Provisional Application No. 62/608,462, filed on Dec. 20, 2017, entitled, "A Transistor Device Having a Pillar Structure," which is incorporated herein by reference in its entirety.

TECHNICAL FIELD

This description relates to a transistor device having a pillar structure.

BACKGROUND

Some transistor devices may be subject to, for example, a parasitic bipolar transistor that can be triggered and can prevent turn-off of the transistor device. The parasitic bipolar transistor can be triggered by self-biasing in the base of the parasitic bipolar transistor due to substrate current. Thus, a need exists for systems, methods, and apparatus to address the shortfalls of present technology and to provide other new and innovative features.

SUMMARY

In at least one general aspect, an apparatus can include a first trench disposed in a semiconductor region and including a gate electrode, and a second trench disposed in the semiconductor region. The apparatus can include a mesa region disposed between the first trench and the second trench, and a source region of a first conductivity type disposed in a top portion of the mesa region. The apparatus can include an epitaxial layer of the first conductivity type, and a body region of a second conductivity type disposed in the mesa region and disposed between the source region and the epitaxial layer of the first conductivity type. The apparatus can include a pillar of the second conductivity type disposed in the mesa region such that a first portion of the source region is disposed lateral to the pillar and a second portion of the source region is disposed above the pillar.

The details of one or more implementations are set forth in the accompanying drawings and the description below. Other features will be apparent from the description and drawings, and from the claims.

BRIEF DESCRIPTION OF THE DRAWINGS

FIGS. 4A and 4B illustrate perspective views of another variation of a transistor.

FIGS. 5A and 5B illustrate perspective views of yet another variation of a transistor.

FIGS. 6A through 6F are diagrams that illustrate a process of making a transistor as described herein.

DETAILED DESCRIPTION

The transistors described here can have source region defined so that a parasitic bipolar device (e.g., NPN bipolar transistor device) included within the transistor is prevented from being activated in an undesirable fashion. Specifically, a transistor structure, as described herein, can be configured to prevent turn-on of a parasitic bipolar device included in the transistor structure when the transistor structure is being turned-off. The activation of the parasitic bipolar device can be referred to as latch-up and can be triggered in response to self-biasing of the base in the parasitic bipolar device in response to a substrate current. The transistor devices described herein can be configured with structures that reduce the base resistance while maintaining a desirable on-resistance. Thus reducing, or eliminating, undesirable latch-up conditions associated with a parasitic bipolar device when the transistor structure is being turned-off.

For example, a source region of a transistor, as described herein, can have a pillar structure included within the source region that has a conductivity type opposite a conductivity type of the source region. As a specific example, in a trench metal-oxide-semiconductor field effect transistor (MOSFET) device, the surface of a silicon mesa (mesa top and mesa sidewall) can have an N-type conductivity, and the middle (e.g., middle portion) of the silicon mesa can include a pillar, which can have P-type conductivity. The P-type conductivity pillar (e.g., P-pillar) can be in contact with a body region of the MOSFET device. These pillar structures within the transistor, for example, can be used to reduce base resistance while maintaining a desirable on-resistance of the transistor. Accordingly, undesirable latch-up conditions associated with a potential parasitic bipolar device can be reduced, or eliminated, when the transistor is being changed to an off state.

The channel and mesa top of a conventional structure can be connected by a P-type high concentration body layer that does not operate in a desirable fashion as a channel. Therefore, when trying to reduce the body, in order to reduce the base resistance, the effective channel area is decreased. In contrast, transistors with the pillar structures described herein can have a relatively shallow body region without affecting, in an adverse fashion, performance in the channel region. The transistors described herein are configured to prevent parasitic bipolar device turn-on by, for example, reducing the base resistance of the parasitic device without channel area penalty (e.g., reduced channel area).

Figure 1A:
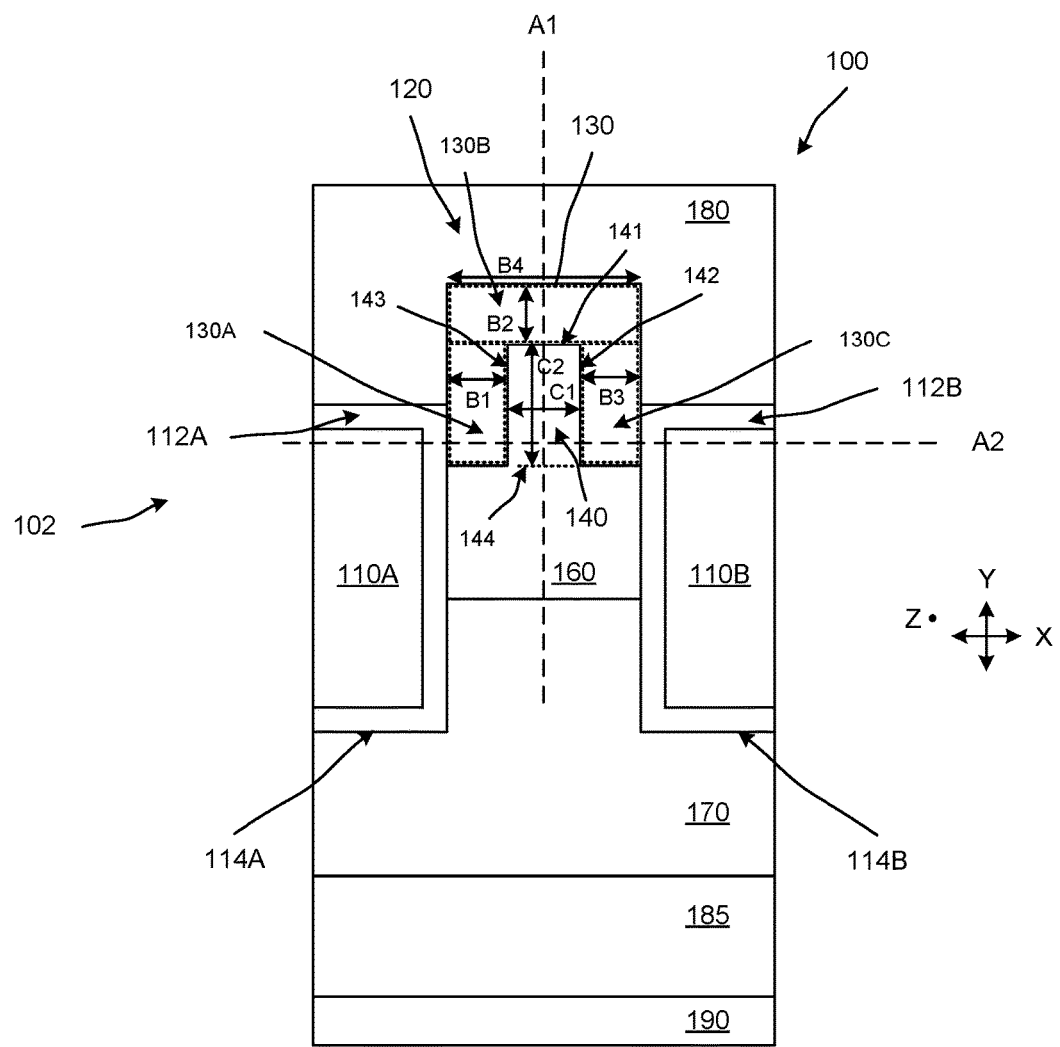
FIG. 1A is a diagram that illustrates a cross-sectional view of a transistor, according to an implementation.

FIG. 1A is a diagram that illustrates a cross-sectional view of a transistor 100 (e.g., vertical transistor device, MOSFET device), according to an implementation. The transistor 100 shown in FIG. 1A has a mesa region 120 (also can be referred to as a mesa) disposed between a pair of trenches 114A, 114B formed in (e.g., defined within) a semiconductor region 102. The mesa 120 (or sidewalls thereof) can be defined, at least in part by, the pair of trenches 114A, 114B. Each of the trenches 114A, 114B, respectively, includes an electrode 110A, 110B (e.g., a gate electrode) insulated, respectively, by a dielectric layers 112A, 112B.

The mesa 120 includes a source region 130, a body region 160, and at least a portion of an epitaxial layer 170. The source region 130 and the epitaxial layer 170 can each be of a first conductivity type. The body region 160, which is disposed between (e.g., disposed vertically between) the source region 130 and the epitaxial layer 170, is of a second conductivity type. The first conductivity type is opposite that of the second conductivity type. In some implementations, the transistor 100 (and other transistors disclosed herein) can be associated with only a few unit cells. In some implementations, the first conductivity type can be an N-type conductivity (e.g., an N-type dopant (e.g., phosphorus (P), arsenic (As), antimony (Sb))) and the second conductivity type can be a P-type conductivity (e.g., a P-type dopant (e.g., boron (B), aluminum (Al), gallium (Ga))). In some implementations, the first conductivity type can be a P-type conductivity and the second conductivity type can be an N-type conductivity. The conductivity types described herein, although discussed as being associated with a particular type of dopant, can be reversed to form different devices (e.g., P-channel devices, N-channel devices).

A channel (or channels) can be defined within the source region 130 when the transistor 100 is in an on-state (based on an applied voltage to the electrodes 110A, 110B). Current can flow between the source conductor 180 and the drain conductor 190 when the transistor 100 is in an on-state.

A source conductor 180 is in contact with the source region 130. The source conductor 180 is insulated from the electrodes 110A, 110B by the respective dielectric layers 112A, 112B. The epitaxial layer 170 can be disposed on a substrate 185, and a drain conductor 190 can be in contact with the substrate 185. The vertical direction (which is the depth direction or the height direction) in this implementation is aligned along the y-axis. The horizontal direction (which is the width direction or the lateral direction) in this implementation is aligned along the x-axis. The length direction in this implementation is aligned along the z-axis. As oriented in FIG. 1A, a top of the transistor 100 can be towards the source portion (e.g., source region 130, source conductor 180), and a bottom of the transistor 100 can be towards the drain portion (e.g., drain conductor 190).

As shown in FIG. 1A, the transistor 100 includes a pillar 140 of the second conductivity type. The pillar 140 is in contact with the body region 160 and disposed above (along the vertical direction) the body region 160. The pillar 140 can have a dopant concentration greater than that of the body region 160.

Without the pillar 140, the transistor 100 can be subject to latch-up of a parasitic bipolar device that can prevent the transistor 100 from turning off in a desirable fashion. The parasitic bipolar device can include, for example, the source region 130 (e.g., emitter), the body region 160 (e.g., base), and the epitaxial layer 170 (e.g., collector). In some implementations, the pillar 140 can be used to reduce the resistance of a path to a body contact (not shown in FIG. 1A, but the body contact can be in the Z-direction along the length of the mesa 120), thus preventing turn-on of the parasitic bipolar device. The path can include the body region 160, which can function as a base of a parasitic bipolar device. This mechanism and the latch-up scenario are described in more detail in connection with at least, for example, FIGS. 3A and 8.

Because the transistor 100 includes the pillar 140, even in implementations where the width of the mesa 120 is relatively narrow (e.g., narrowed to a sub-micron width), the on-resistance of the transistor 100 can be maintained at a desirable level. Also, the base resistance of the parasitic NPN structure (e.g., the body region 160) can be decreased using the pillar 140 without an undesirable affect on the channel of the transistor 100 (e.g., decrease in channel area).

The pillar 140 and the source region 130 are in a top portion of the mesa 120. The pillar 140 of the second conductivity type is disposed in the mesa region 130 so that a first portion 130A and third portion 130C (which can be referred to as side portions) of the source region 130 is disposed lateral to the pillar 140. The pillar 140 is disposed between the first portion 130A and the third portion 130C. A second portion 130B (also can be referred to as a top portion) of the source region 130 is disposed above the pillar 140. The first portion 130A can be contiguous with (e.g., can be in contact with) the second portion 130B. The second portion 130B can be contiguous with (e.g., can be in contact with) the third portion 130C.

In this implementation, the pillar 140 is aligned along a vertical axis A1 (or plane). The vertical axis A1 intersects (in order from top to bottom) the second portion 130B of the source region 130, the pillar 140, the body region 160 (which is below the pillar 140), and the epitaxial layer 170. As shown in FIG. 1A, a horizontal axis A2 (or plane) intersects the electrodes 110A, 110B (and dielectric layers 112A, 112B), the portions 130A, 130C, and the pillar 140. The horizontal axis A2 is orthogonal to the vertical axis A1 and is aligned parallel to the top surface of the mesa 120 and the x-axis.

The pillar 140 is at least partially surrounded by the source region 130. In this implementation, a top surface 141 of the pillar 140 is covered, at least on three sides (top and sidewalls) by the source region 130. In this implementation, a top surface 141 of the pillar 140 is covered by (e.g., entirely covered by, surrounded by) the source region 130 (e.g., the second portion 130B). The side surfaces 142, 143 of the pillar 140 are covered by (e.g., surround by) the source region 130 (e.g., the first portion 130A and third portion 130C).

As shown in FIG. 1A, the pillar 140 is disposed in a top portion of the mesa 120. In this implementation shown in FIG. 1A, the top surface 141 of the pillar 140 is separated from a top surface of the mesa 120. In other words, the top surface 141 of pillar 140 is below a top surface of the mesa 120. Specifically, the top surface 141 of the pillar 140 is separated from the bottom surface of the source conductor 180 (which is at an interface between the source conductor 180 and the mesa 120) by the source region 130. The source conductor 180 is in contact with the source region 130 and, in some implementations, can define an Ohmic contact with the source region 130. As shown in FIG. 1A, the top surface 141 of the pillar 140 is above (e.g., vertically above) a top surface of each of the electrodes 110A, 110B. Also, as shown in FIG. 1A, the top surface 141 of the pillar 140 is above (e.g., vertically above) a top surface of each of the dielectric layers 112A, 112B.

The top surface of the mesa 120 (e.g., the top surface of the source region 130) is also disposed above (e.g., vertically above) a top surface of each of the electrodes 110A, 110B and the dielectric layers 112A, 112B. The portion 130B of the source region 130 is disposed above (e.g., vertically above) a top surface of each of the electrodes 110A, 110B and the dielectric layers 112A, 112B.

A bottom 144 of the pillar 140, which is at an interface between the body region 160 and the pillar 140, is illustrated by a dashed line. The bottom 144 of the pillar 140 is approximately the location of the transition in different dopant concentrations between the body region 160 and the pillar 140. The bottom 144 of the pillar 140 is below a top surface of each of the electrodes 110A, 110B. An interface between the body region 160 and the epitaxial layer 170 is also below (e.g., vertically below) a top surface of each of the electrodes 110A, 110B.

As shown in FIG. 1A, the bottom 144 of the pillar 140 is aligned with a bottom (e.g., bottom surface) of the source region 130 (and/or portions 130A, 130C thereof). In some implementations, the bottom 144 of the pillar 140 may be above (e.g., vertically above) or below (e.g., vertically below) the bottom of the source region 130.

The respective thicknesses B1, B2, B3 of each of the portions 130A, 130B, 130C can be the same. In some implementations, the thickness B2 of the portion 130B can be less than the thickness B1 and/or thickness B3. In some implementations, the thickness B2 of the portion 130B can be greater than or equal to the thickness B1 and/or thickness B3. The thickness B1 can be equal to the thickness B3 so that the pillar 140 is centered (e.g., aligned in a centered fashion) within the mesa 120 and centered (e.g., aligned in a centered fashion) within the source region 130.

As shown in FIG. 1A, the pillar 140 has a width C1 that is less than a height C2. In some implementations, the pillar 140 can have a width C1 that is approximately half of a width B4 of the mesa 120 (and source region 130 and/or body region 160). In some implementations, the pillar 140 can have a width C1 that is more than or less than half of a width B4 of the mesa 120. In some implementations, the width B4 of the mesa 120 can be a fraction of a micron (e.g., less than 0.3 μm, less than 0.2 μm). Accordingly, the width C1 of the pillar 140 can be a fraction of a micron (e.g., less than 0.2 μm, less than 0.1 μm).

In some implementations, the pillar 140 can have a width C1 that is less than a combined width of the widths B1, B3 (of the portions 130A, 130C). Accordingly, the width B1, or the width B3 can be less than half of the width C1. In some implementations, the pillar 140 can have a width C1 that is greater than or equal to the combined width of the widths B1, B3 (of the portions 130A, 130C). Accordingly, the width B1, or the width B3 can be greater than or equal to half of the width C1.

The pillar 140 may have a shape different than the rectangular cross-sectional shape (e.g., profile) shown in FIG. 1A. For example, the pillar 140 can have rounded corners on the top portion of the pillar 140. In some implementations, the pillar 140 can be tapered in various ways. For example, the pillar 140 can have a greater width in a top portion than a bottom portion (along a depth direction). As another example, the pillar 140 can have a greater width in a bottom portion than a top portion (along a depth direction). The source region 130 can have a shape that corresponds with (is the same as or confirms with) the profile of the pillar 140.

As noted above, the body region 160 and the pillar 140 are the same conductivity type. In this implementation, the body region 160 and the pillar 140 have the second conductivity type. Accordingly, the pillar 140 can be referred to as a pillar portion of a region of the second conductivity type, and the body region 160 can be referred to as a body portion of the region of the second conductivity type.

Figure 1B:
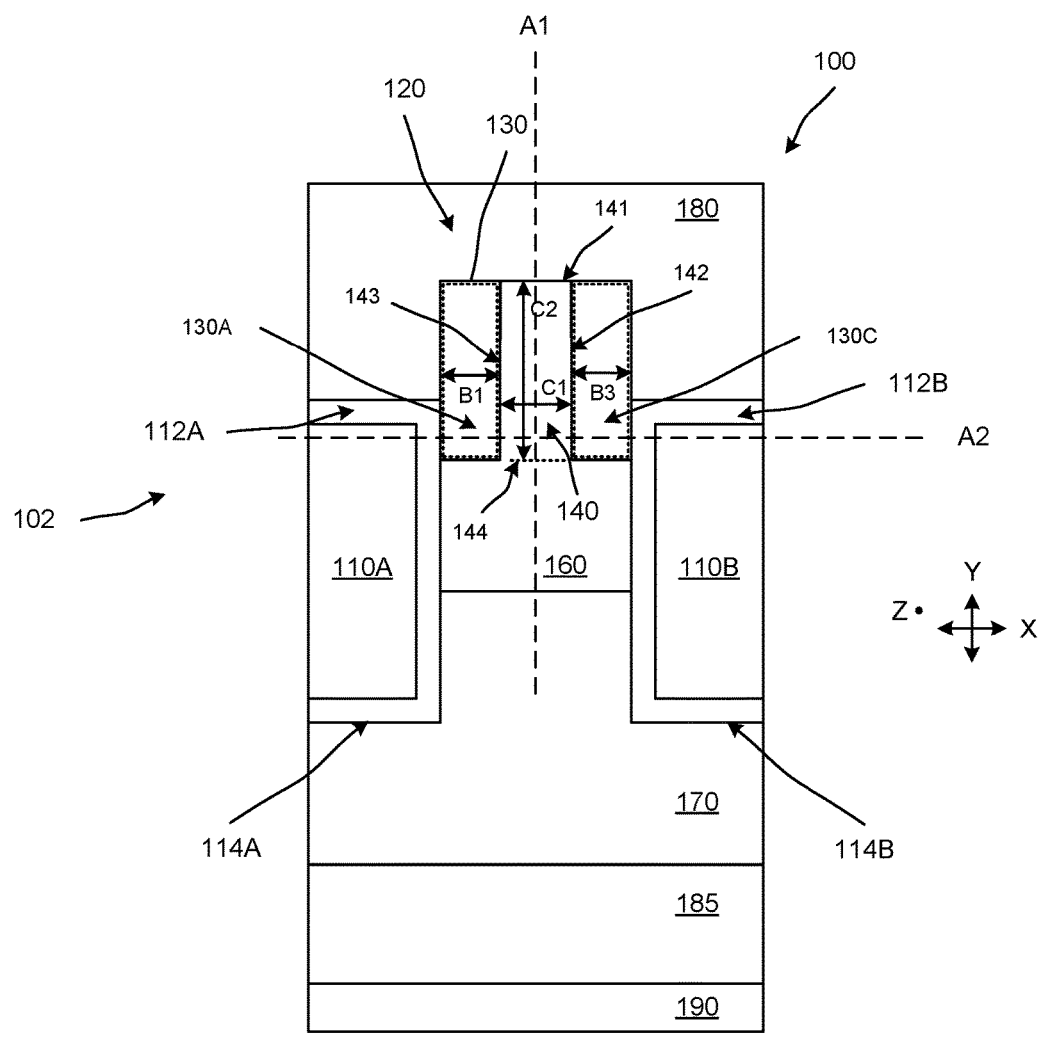
FIGS. 1B through 1F are diagrams that illustrate variations of the cross-sectional view of the transistor illustrated in FIG. 1A.

FIG. 1B is a diagram that illustrates a variation of the cross-sectional view of the transistor 100 illustrated in FIG. 1A. All of the description above with respect to FIG. 1A can be applied to FIG. 1B with exception of a few changes.

As shown in FIG. 1B, the transistor 100 includes a different pillar structure and source region structure. Specifically, as shown in FIG. 1B, the pillar 140 extends vertically (along the y-axis) from the body region 160 to the source conductor 180. Accordingly, a portion (e.g., a portion of the portion 130B shown in FIG. 1A) of the source region 130 is not disposed between the top surface 141 of the pillar 140 and the source conductor 180. The source conductor 180 is in contact with the pillar 140 and, in some implementations, can define an Ohmic contact with the pillar 140.

As shown in FIG. 1B, the source region 130 is divided into two regions (e.g., portions 130A, 130C) that are separated by the pillar 140. In this implementation, the height C1 of the pillar 140 is the same of a height of each of the portions 130A, 130C of the source region 130. In some implementations, the height C1 of the pillar 140 can be greater than or less than a height of one or more of the portions 130A, 130C of the source region 130.

Figure 1C:
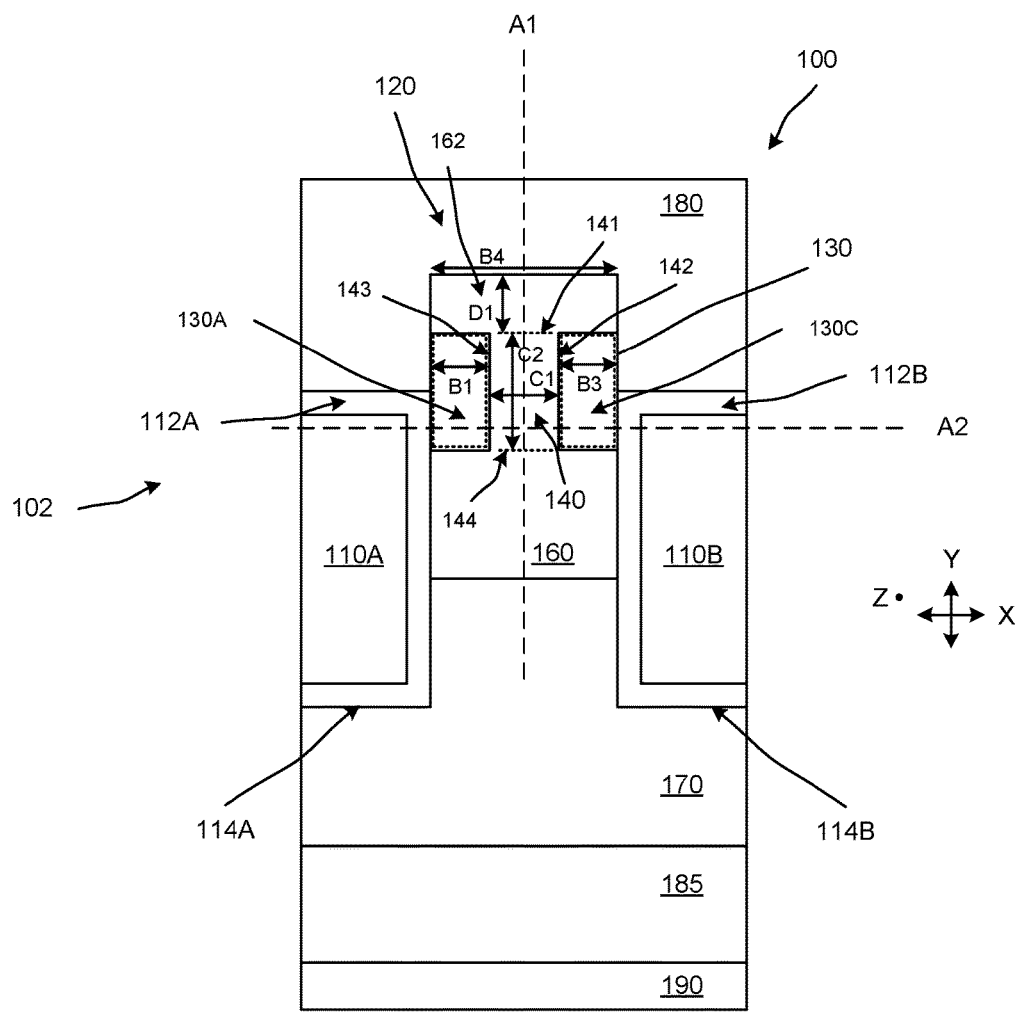

FIG. 1C is a diagram that illustrates another variation of the cross-sectional view of the transistor 100 illustrated in FIG. 1A. All of the description above with respect to FIG. 1A can be applied to FIG. 1C with exception of a few changes.

As shown in FIG. 1C, the transistor 100 includes a body contact 162 of the second conductivity type that is disposed above the pillar structure and the source region structure. Specifically, as shown in FIG. 1C, the pillar 140 is disposed between the body contact 162 (above the pillar 140) and the body region 160 (below the pillar 140). In other words, the pillar 140 is disposed vertically between the body region 160 and the body contact 162. The source conductor 180 is in contact with the body contact 162 and, in some implementations, can define an Ohmic contact with the body contact 162. Accordingly, a portion (e.g., a portion of the portion 130B shown in FIG. 1A) of the source region 130 is not disposed between the top of the pillar 140 (illustrated by 141 and which is at an interface between the body contact 162 and the pillar 140) and the source conductor 180.

As shown in FIG. 1C, the source region 130 is divided into two regions (e.g., portions 130A, 130C) that are separated by the pillar 140. In this implementation, the height C1 of the pillar 140 is the same of a height of each of the portions 130A, 130C of the source region 130. In some implementations, the height C1 of the pillar 140 can be greater than or less than a height of one or more of the portions 130A, 130C of the source region 130. I n this implementation, the combined height C1 of the pillar 140 and the height D1 of the body contact 162 is greater than the height of each of the portions 130A, 130C of the source region 130.

The body region 160 and body contact 162 and the pillar 140 are the same conductivity type (e.g., second conductivity type). Accordingly, the pillar 140 can be referred to as a pillar portion of a region of the second conductivity type, and the body region 160 and body contact 162 can be referred to as first and second body portions of the region of the second conductivity type.

In some implementations, the body contact 162 can have a different dopant concentration than the body region 160 and/or the pillar 140. In some implementations, the body contact 162 can have a dopant concentration greater than that of the pillar 140, and the body region 160 can have a dopant concentration than that of the body region 160. In some implementations, the body contact 162 can function as a body contact for the transistor 100. This body contact implementation will be described in more detail below.

Figure 1D:
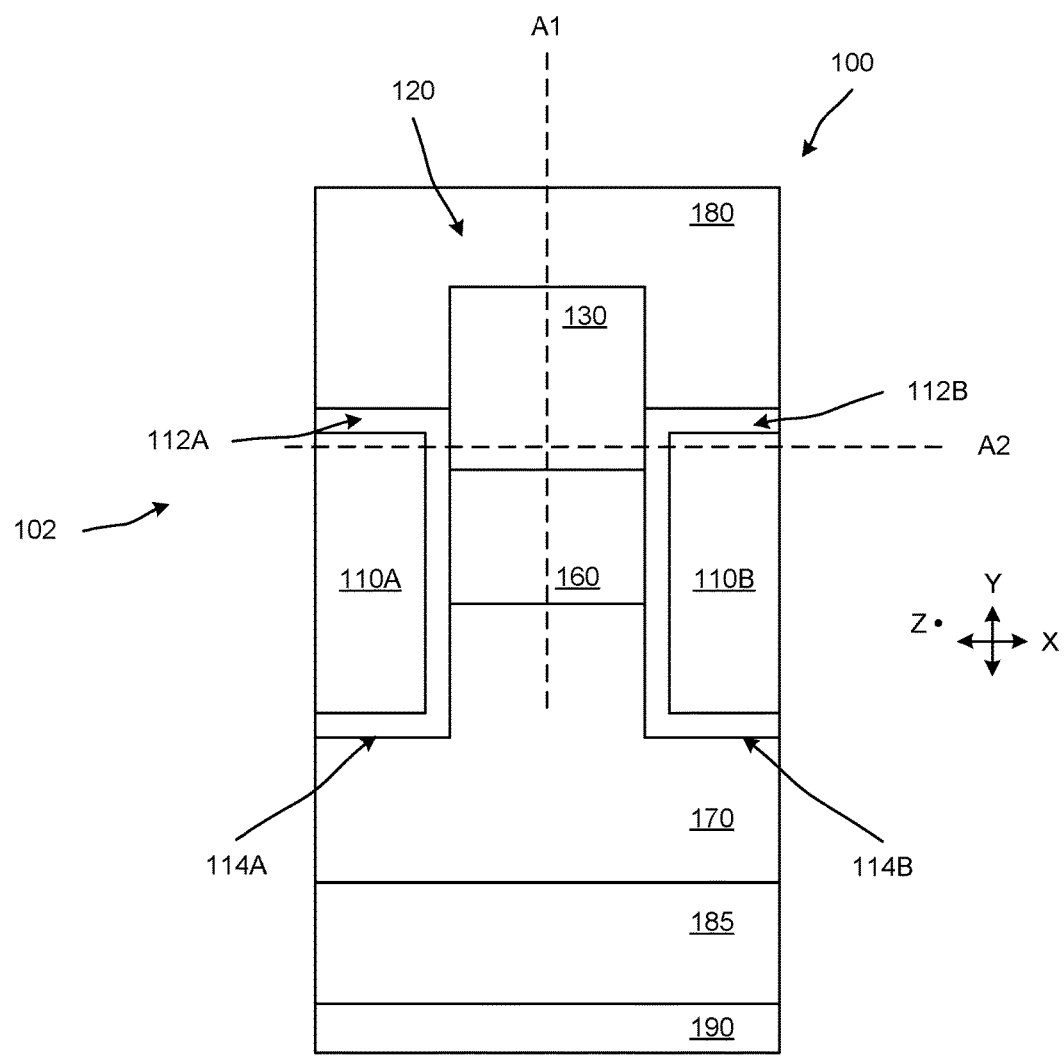

FIG. 1D is a diagram that illustrates a variation of the cross-sectional view of the transistor 100 illustrated in FIG. 1A. In this implementation, the pillar 140 (which is shown and described in connection with the other figures above) is excluded, and the source region 130 is disposed in the top portion of the mesa 120.

Figure 1E:
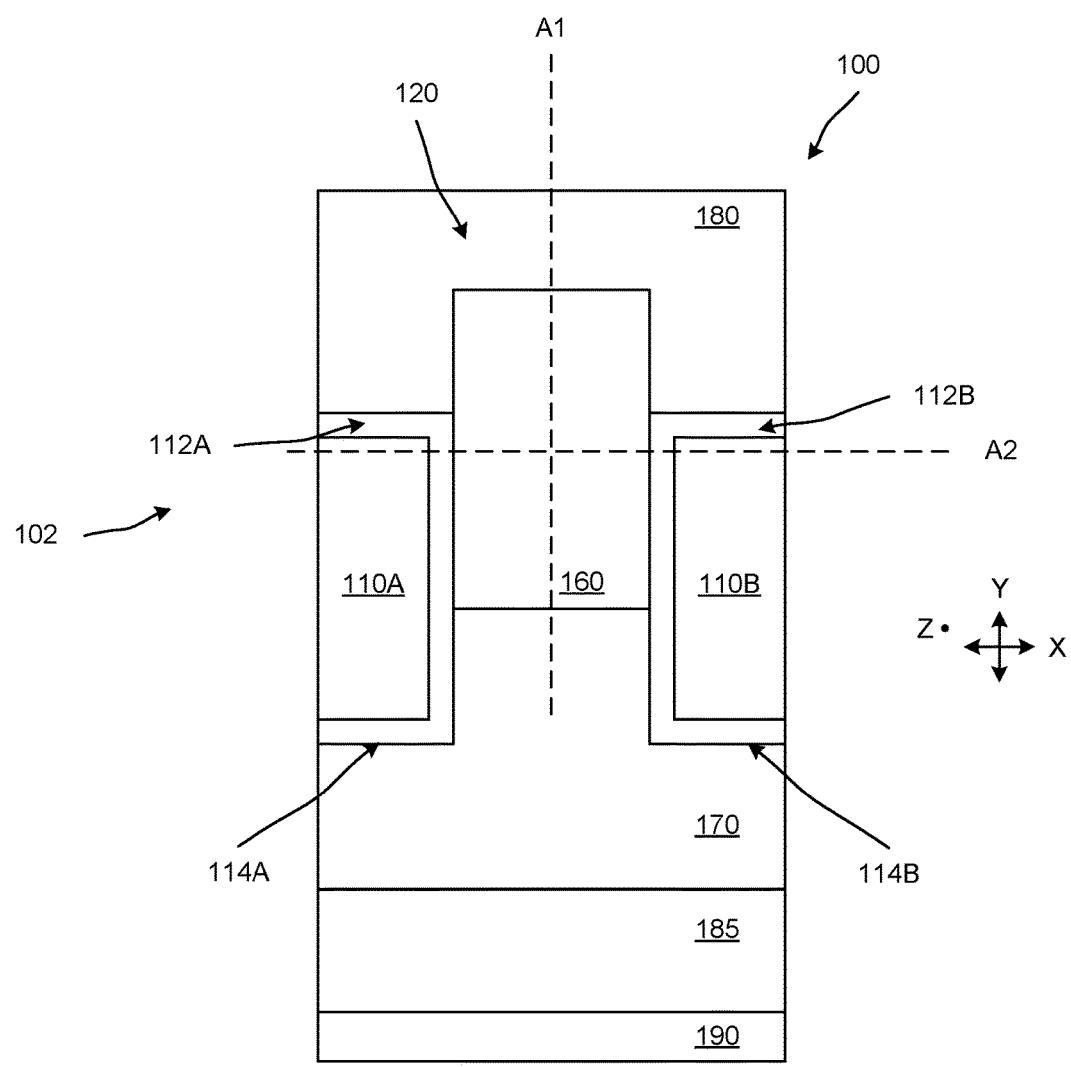

FIG. 1E is a diagram that illustrates a variation of the cross-sectional view of the transistor 100 illustrated in FIG. 1A. In this implementation, the source region 130 and the pillar 140 are excluded. The body region 160 is disposed in the top portion of the mesa 120. Although not shown, in some implementations, the body region 160 can be more lightly doped in a lower (or bottom portion) and more heavily doped in an upper portion.

Figure 1F:
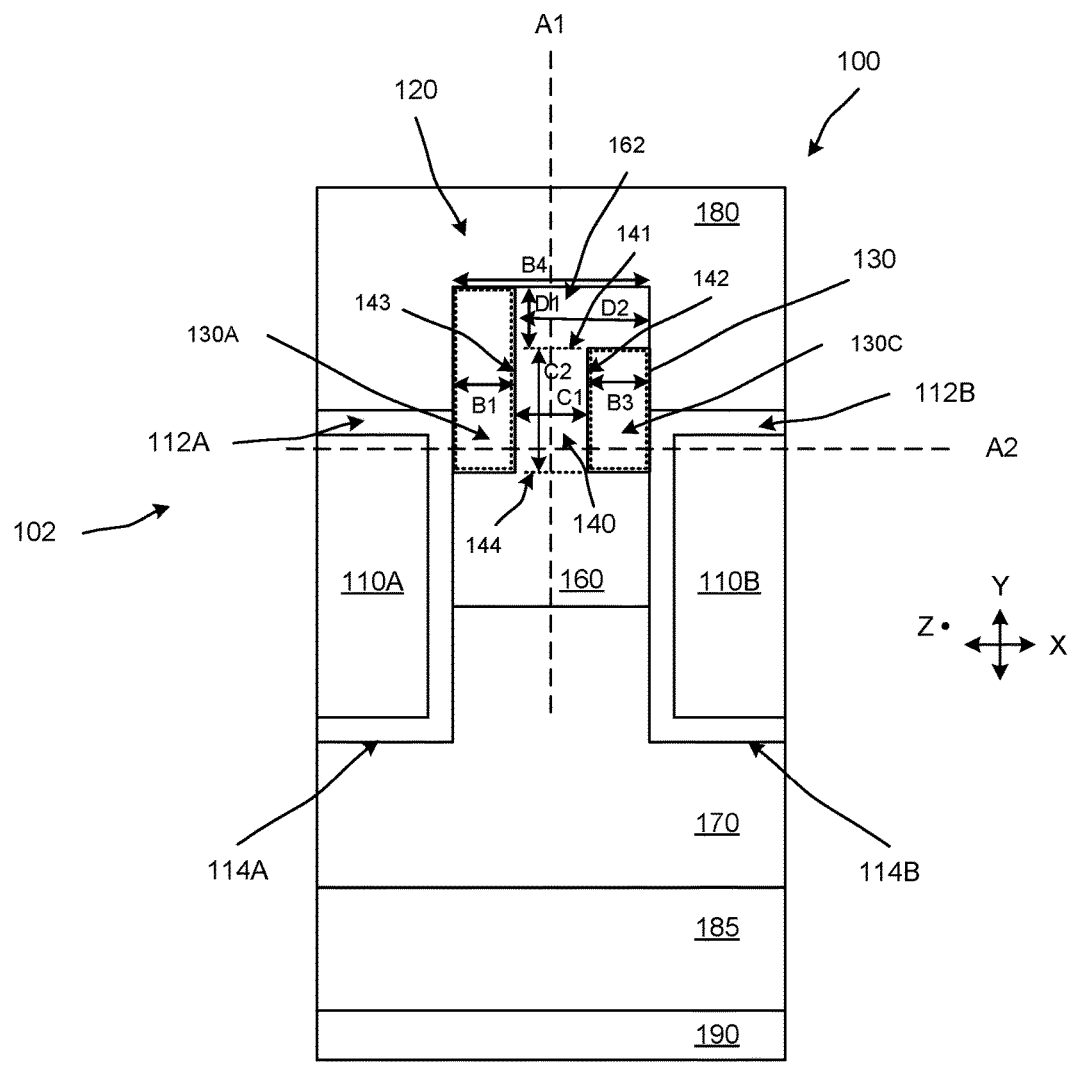

FIG. 1F is a diagram that illustrates another variation of the cross-sectional view of the transistor 100 illustrated in FIG. 1A. All of the description above with respect to at least FIGS. 1A and 1C can be applied to FIG. 1F with exception of a few changes.

As shown in FIG. 1F, the transistor 100 includes a body contact 162 of the second conductivity type that is disposed above pillar structure and the source region structure. Specifically, as shown in FIG. 1F, the pillar 140 is disposed between the body contact 162 (above the pillar 140) and the body region 160 (below the pillar 140). In this implementation, the body contact 162 is asymmetrically oriented within the mesa 120 (is shifted to one side of the mesa 120). Specifically, a portion of the base contact 162 is disposed above the portion 130C of the source region 130. A portion of the base contact 162 is not disposed above (e.g., is excluded from being above) the portion 130A of the source region 130. The base contact 162 is disposed lateral to a portion of the portion 130A of the source region 130.

As shown in FIG. 1F, the source region 130 is divided into two regions (e.g., portions 130A, 130C) that are separated by the pillar 140. In this implementation, the height of the portion 130A is greater than the height C1 of the pillar 140 and the portion 130C of the source region 130. In this implementation, a width D2 of the base contact 162 is less than the width B4 of the mesa 120.

The various cross-section views illustrated in FIGS. 1A through 1F can be combined within a transistor device (e.g., transistor 100) along a length (along the z direction or z-axis) of a mesa (e.g., mesa 120). In other words, the various cross-section views illustrated in FIGS. 1A through 1F can be combined within a transistor device along a longitudinal length of a trench of the transistor device. In some implementations, the transistor 100 can have a portion with the cross-section of FIG. 1A and one or more portions with the cross-section of any of FIGS. 1B, 1C, 1E, and 1F. As another example, the transistor 100 can have a portion with the cross-section of FIG. 1D and one or more portions with the cross-section of any of FIGS. 1B, 1C, 1E, and 1F. As yet another example, the transistor 100 can have a portion with the cross-section of FIG. 1B and one or more portions with the cross-section of any of FIGS. 1C, 1E and 1F.

Figure 2:
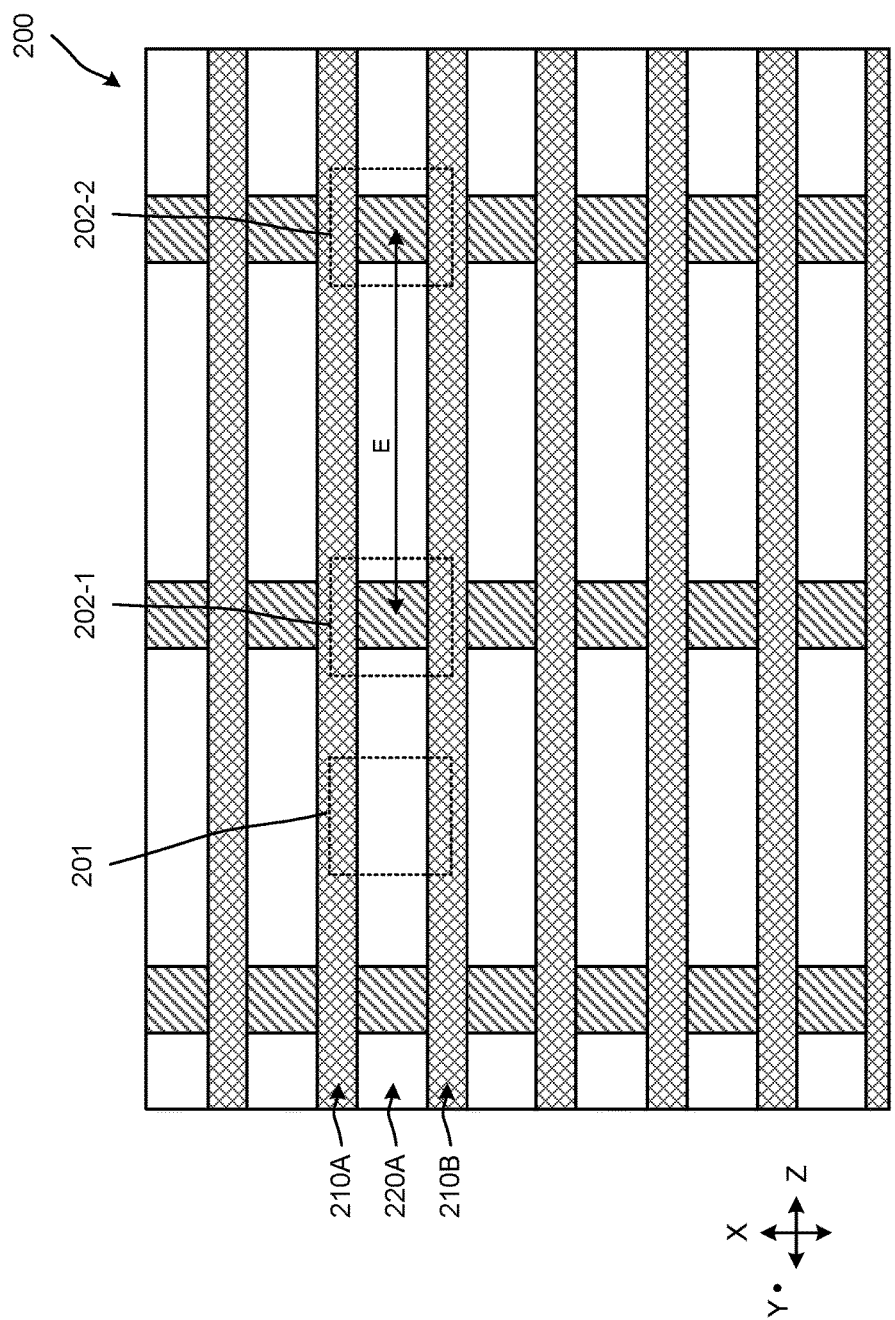
FIG. 2 illustrates a plan view of a transistor that can have various combinations of cross-sections.

An example plan view of a transistor 200 that can include various combinations of the cross-sections illustrates in FIGS. 1A through 1D is illustrated in FIG. 2. As shown in FIG. 2, the transistor 200 can have a device region 201 (e.g., a channel region or active region) and a body contact region 202-1 along a mesa 220A (extending along direction Z). Parallel trenches 210A, 210B (also extending along direction Z) are also illustrated in FIG. 2. The cross-sections illustrated in FIGS. 1A through 1F can be included in various combinations along the length of the mesa 220A. As a specific example, the device region 201 can have the cross-section illustrated in FIG. 1A, and the body contact region 202-1 can have the cross-section of any of FIGS. 1B, 1C, 1E and 1F. Another of the body contact regions (e.g., body contact region 202-2) along mesa 220A (or another mesa) can have a different cross-sectional profile than that of body contact region 202.

A body pitch E is also illustrated in FIG. 2. In some implementations, a relatively narrow body pitch E can be implemented to decrease a base resistance of a parasitic NPN bipolar device. In some implementations, the body contacts (e.g., body contact regions 202-1, 202-2) can include doped regions that function as a body contact for the transistor 200. In some implementations, the body contact regions can be at a same potential as the source region.

Perspective views that combine the concepts discussed in connection with FIGS. 1A through 2 are shown and described in connection with FIGS. 3A through 5B. Details shown and described in FIGS. 1A through 2 may not be shown (and/or labeled) in some of the views of FIGS. 3A through 5B to simplify the drawings and to focus on additional details.

Figure 3A:
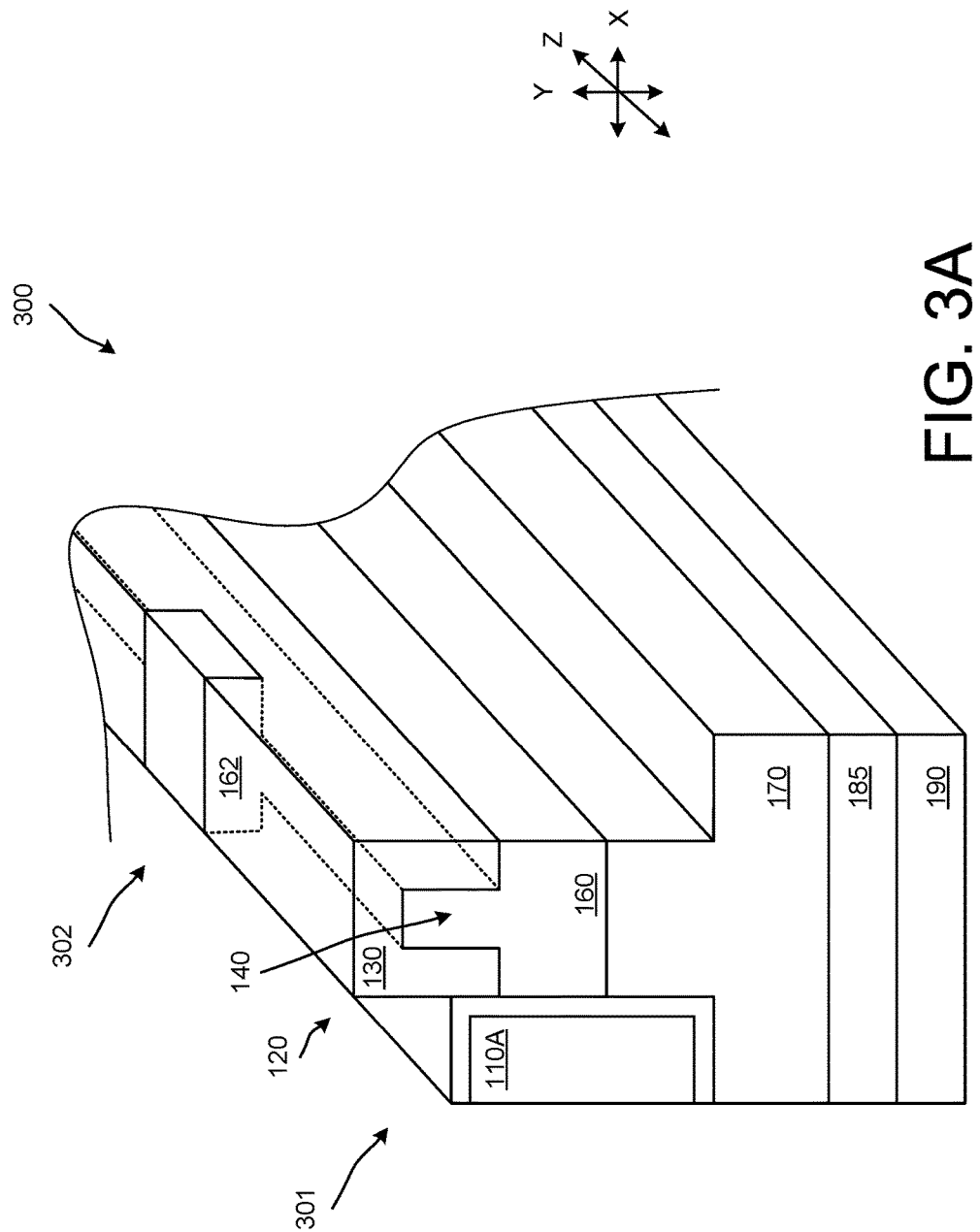
FIGS. 3A through 3C illustrate perspective views of a variation of a transistor.

FIG. 3A illustrates a perspective view of a variation of the transistor 100. As shown in FIG. 3A, a device region 301 of the transistor 100 has a cross-sectional profile corresponding to that of FIG. 1A and the body contact region 302 of the transistor 100 has a cross-sectional profile corresponding to that of FIG. 1C.

As shown in FIG. 3A, the pillar 140 (shown with dashed lines) extends along the length Z (e.g., longitudinal axis of the mesa 120) of the transistor 300. The pillar 140 extends continuously below the body contact 162 (e.g., corresponding to the body contact in FIG. 1C) in the body contact region 302. In other words, the pillar 140 and the source region 130 (with multiple portions 130A through 130C) can be within a first cross-sectional slice (e.g., plane) of the transistor 300, and the pillar 140 can be in contact with the body contact 162 at a second cross-sectional slice of the transistor 300. The pillar 140 defines an electrical path between (and including) the body region 160 and the body contact 162. In some implementations, the body contact 162 can function as a body contact for the transistor 300. In some implementations, the body contact 162 can be at a same potential as the source region 130.

Under reverse bias and avalanche conditions, charge flows through the channel region in the body region 160 to the body contact 162 (which functions as a body contact (or body diode)). The inclusion of the pillar 140 in the mesa 120 results in an overall cross-sectional area of material on a path to body contact 162 that lowers the resistance in the channel region (which is in the body region 160). In other words, the cross-sectional area of the combination of the pillar 140 and the body region 160 allows for relatively more current to flow to the body contact 162 (especially in under reverse bias and avalanche conditions). This can result in the latch-up voltage of the parasitic bipolar device being increased. Without the pillar 140, the cross-sectional area of the base region of the parasitic bipolar (which corresponds with the body region 160) would be decreased and the transistor 300 would be more susceptible to latch-up of the parasitic bipolar device.

Figure 3B:
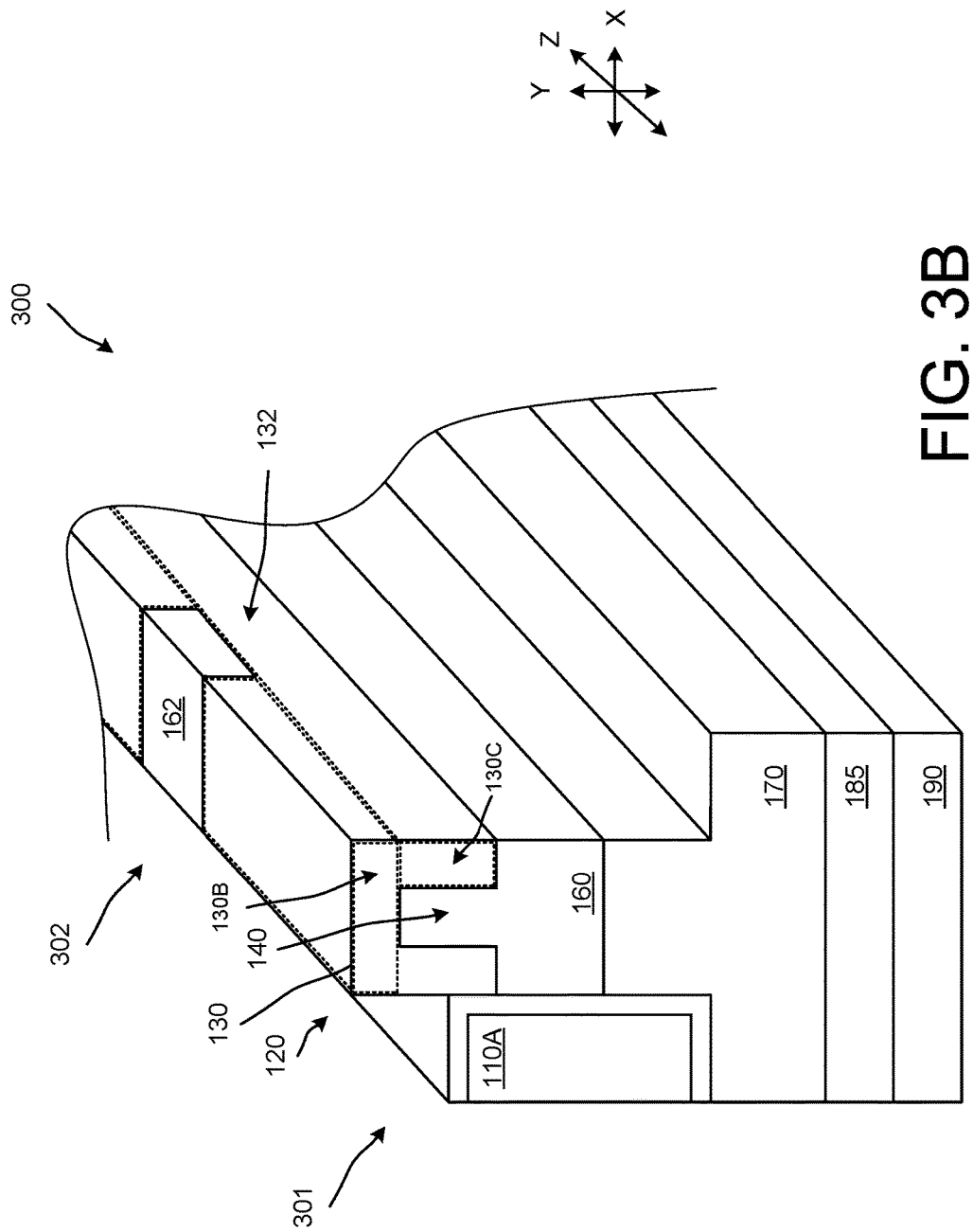

FIG. 3B is a diagram that illustrates the same perspective view and example as shown in FIG. 3A. In this view, the source region 130 is shown as a solid block and the portions 130B, 130C of the source region 130 are illustrated.

As shown in FIG. 3B, the portion 130B of the source region 130 is discontinuous (e.g., interrupted, broken) above the pillar 140. In other words, the portion 130B of the source region 130 is discontinuous along the length of the mesa 120 (where the mesa 120 has a length aligned along a longitudinal axis orthogonal to a vertical axis along a height of the mesa 120 and orthogonal to a width of the mesa 120). The portion 130B of the source region 130 has a discontinuity at the body contact 162, but is continuous above at least a portion of the body region 160.

As shown in FIG. 3B, the source region 130 is continuous below the body contact 162. In some implementations, the portion 130C of the source region 130 is continuous below the body contact 162. The portion below the body contact 162 that is continuous below the body contact 162 is illustrated as portion 132. In some implementations, the portion 130C of the source region 130 is continuous along a length of the mesa 120 below the discontinuity of the portion 130C of the source region 130 at (or below) the body contact 162.

In some implementations, because the portion 130C of the source region 130 is continuous, a channel region can be formed within the transistor 300 even in the body contact region 302 of the transistor 300. This can result in a decrease in on-resistance of the transistor 300 (compared with implementations without continuity of the source region 130 in the body contact region 302).

Figure 3C:
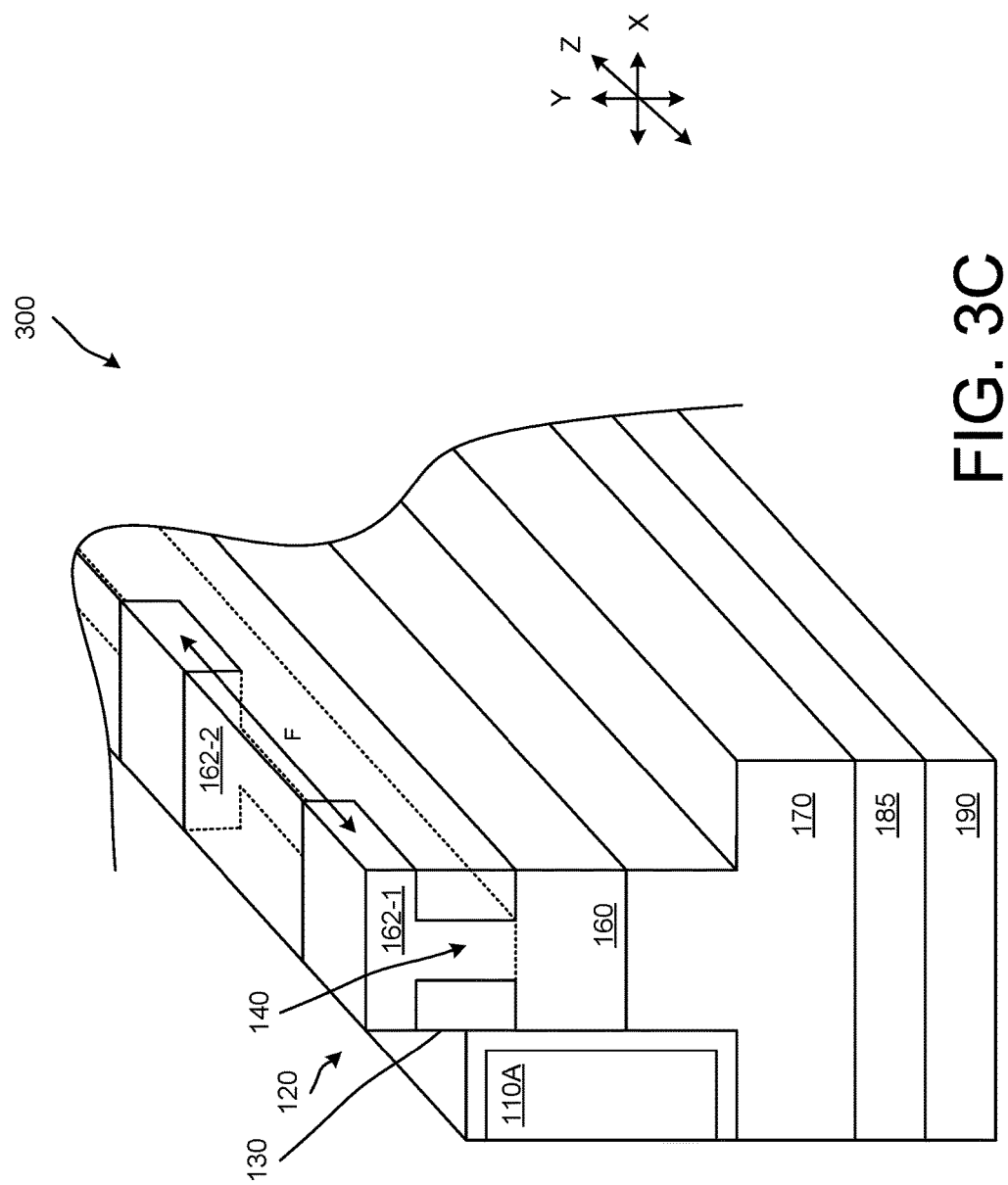

FIG. 3C is a diagram of the transistor 300 that illustrates a body pitch F (e.g., center-to-center pitch) between body contacts 162-1 and 162-2. In this implementation, the width of the body contact 163 can be relatively large without having an impact on the on-resistance of the transistor 400 because of the continuous source region. Although not shown, in the body region 302, the cross-section shown in, for example, FIG. 1B can be used instead of the cross-section associated with FIG. 1C.

Figure 3D:
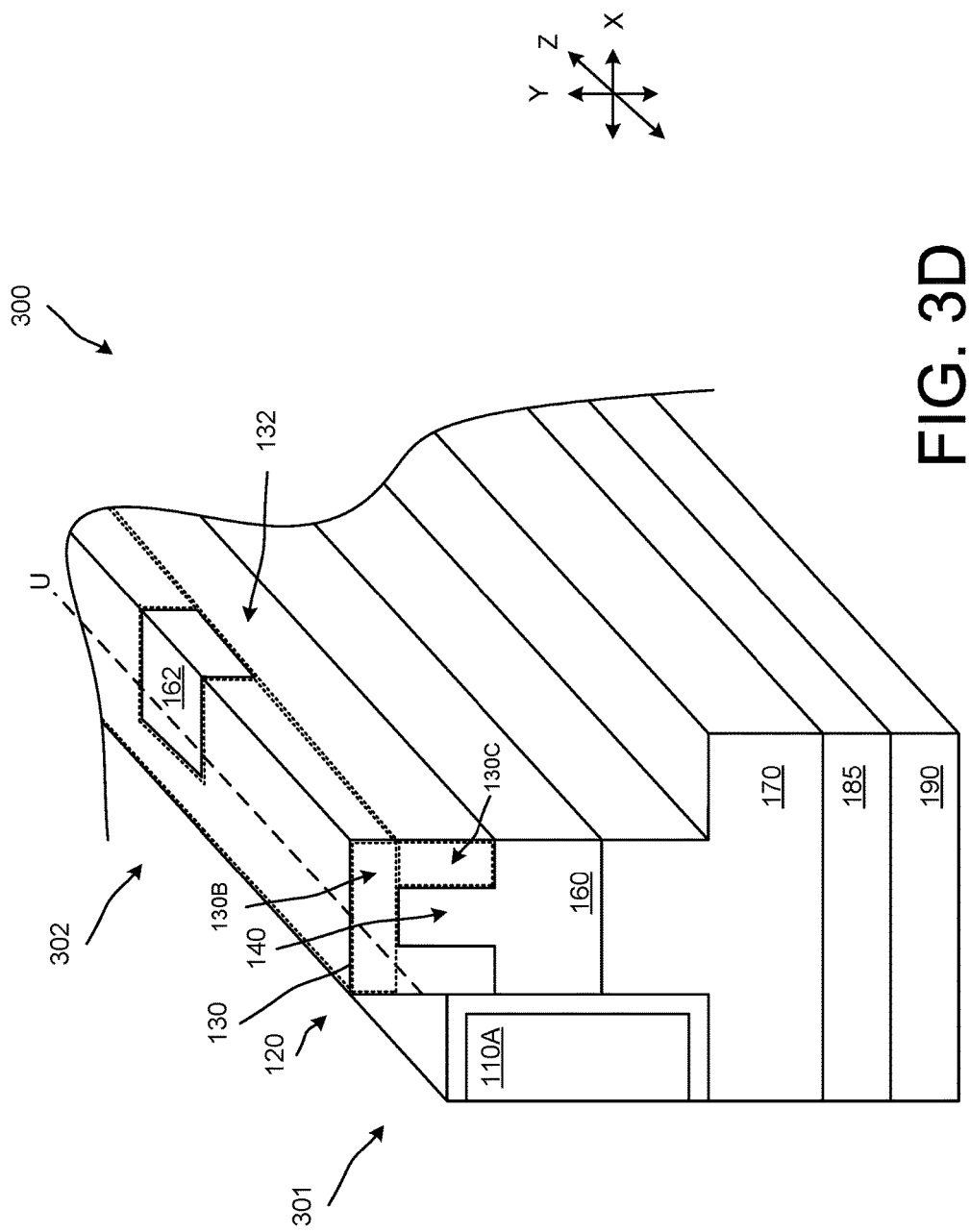
FIG. 3D illustrates a variation of the implementations described in connection with FIGS. 3A through 3C.

FIG. 3D illustrates a variation of the implementations described in connection with FIGS. 3A through 3C. The body contact 162 in this implementation is asymmetrically defined within the mesa 120. The body contact 162 has a larger volume on a first side of a centerline U (or longitudinal axis) of the mesa 120 (and pillar 140) than a second side of the centerline U (or longitudinal axis) of the mesa 120 (and pillar 140). Accordingly, the top portion 130B of the source region 130 may not be discontinuous along the mesa 120 at the body contact 162. The top portion 130B may be recessed at the body contact 162, but will be continuous. Accordingly, a width of the top portion 130B of the source region 130 at the body contact 162 (and in the body contact region 302) will be less then a width of the top portion 130B of the source region 130 within the device region 301.

FIG. 4A illustrates a perspective view of another variation of the transistor 100. As shown in FIG. 4A a device region 401 of the transistor 100 has a cross-sectional profile corresponding to that of FIG. 1A and the body contact region 402 of the transistor 100 has a cross-sectional profile corresponding to that of FIG. 1E. The body contact region 402 includes body contact 163, which can have a heavier doping concentration than body region 160. In this implementation, the source region 130 is discontinuous along the length of the mesa 120 due to the body contact 163.

Figure 4B:
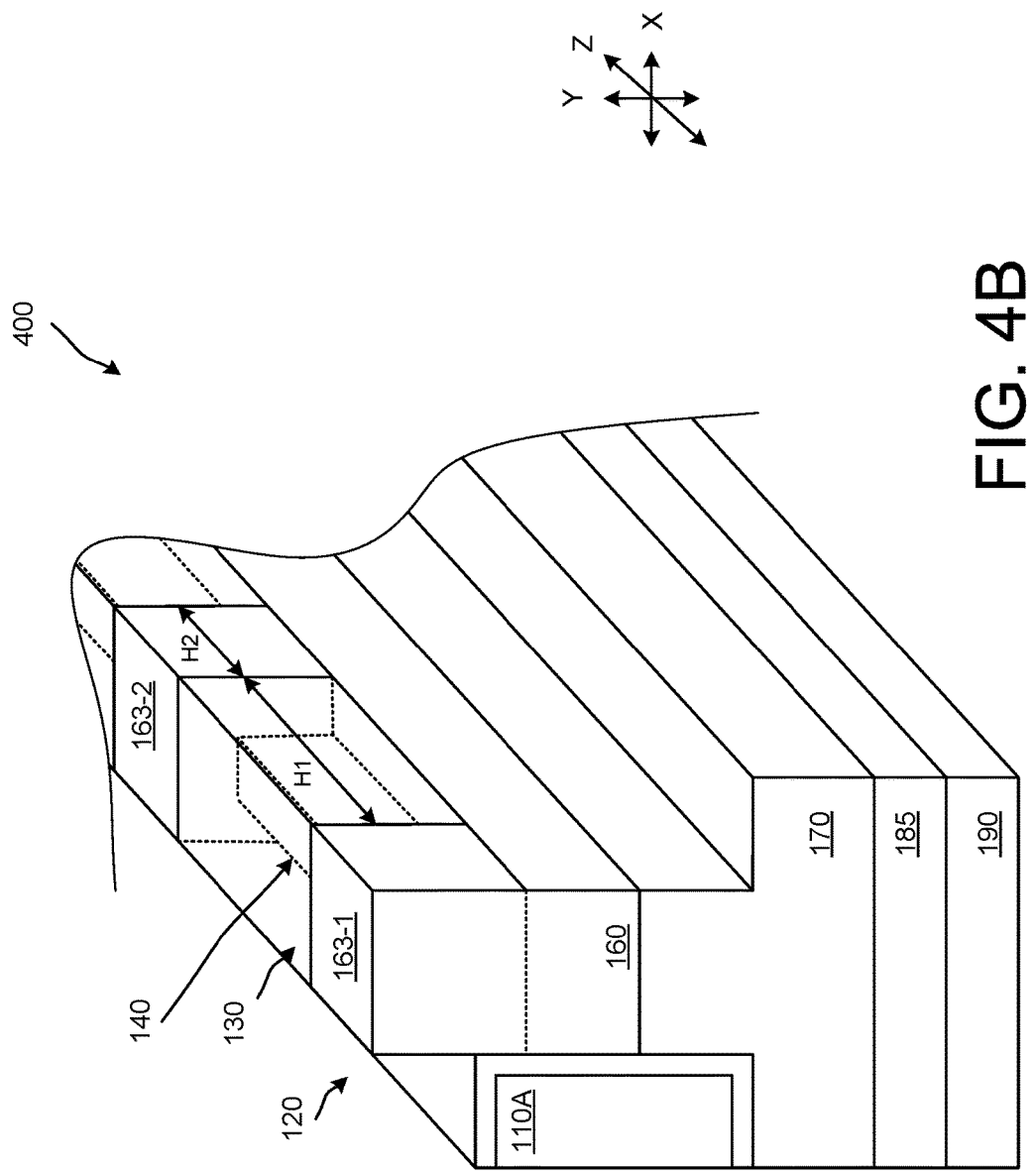

FIG. 4B is a diagram of the transistor 400 that illustrates a length H1 of the source region 130 between the body contacts 163-1 and 163-2. A length H2 (of the body contacts (e.g., body contact 163-2)) can be less than the length H1 of the source region 130. In some implementations, the length H1 can be more than two times greater than the length H2 (e.g., a ratio of the length H1 to the length H2 can be 10:3). With a relatively narrow length H2, an on-resistance of the transistor 400 can be favorable (even when compared with the implementation in FIGS. 3A through 3D).

FIG. 5A illustrates a perspective view of yet another variation of the transistor 100. As shown in FIG. 5A a device region 501 of the transistor 100 has a cross-sectional profile corresponding to that of FIG. 1A and the body contact region 502 of the transistor 100 has a cross-sectional profile that corresponds to that of FIG. 1C in one portion (body contact 164A, 164C) and corresponds to that of FIG. 1E in another portion (body contact 164B). The body contacts 164A through 164C can have heavier doping concentrations than the pillar 140 and/or the body region 160. In this implementation, the source region 130 is discontinuous along the length of the mesa 120 due to the body contact 165.

Figure 5B:
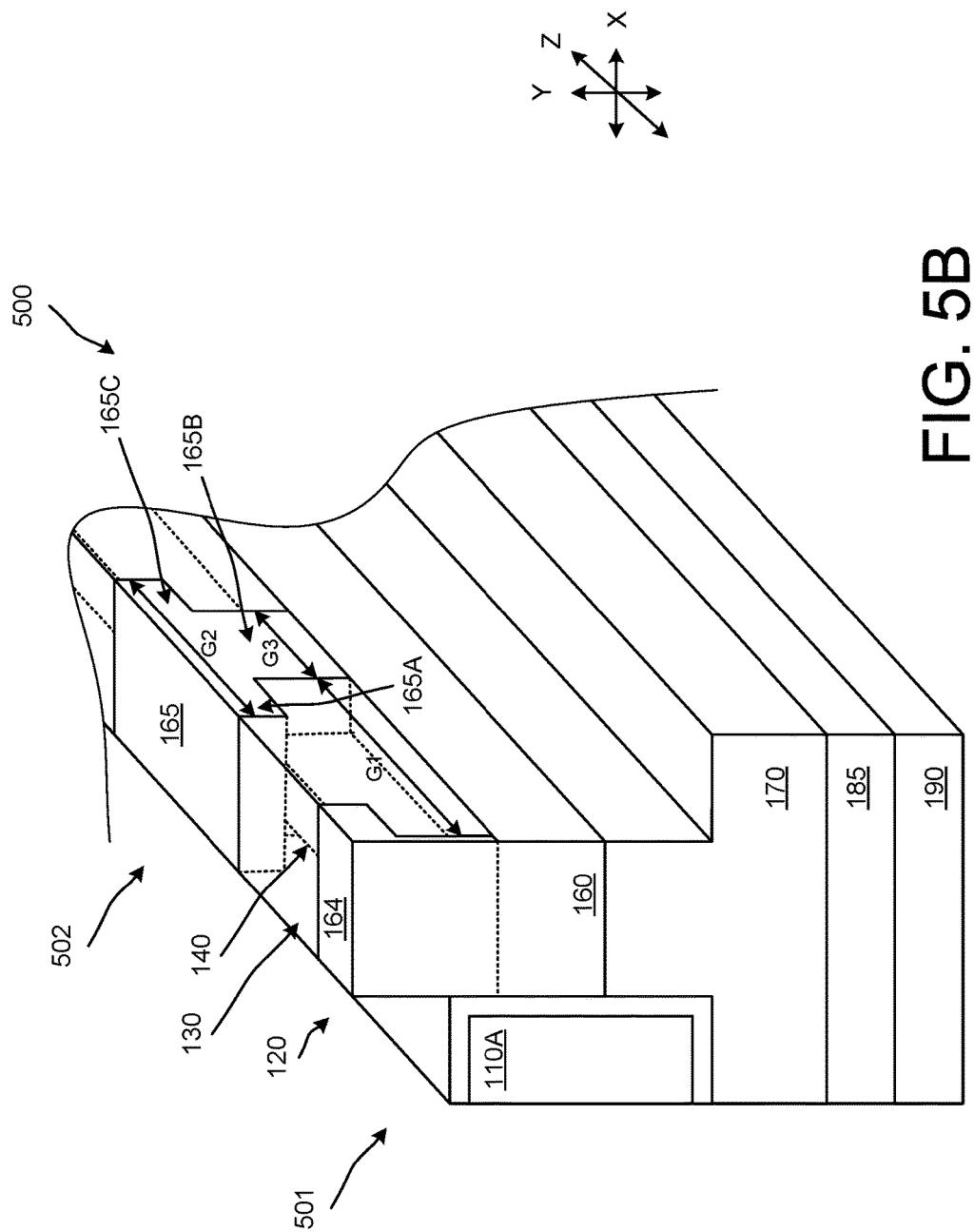

FIG. 5B is a diagram of the transistor 500 that illustrates a length G1 of the source region 130 between the body contacts 164 and 165. Each of the body contacts has a different top portion length than bottom portion length. For example, a bottom portion length G3 (and/or surface area) of the body contact 165 (at an interface between the body contact 165 and the body 160) is less than a top portion length G2 (and/or surface area) of the body contact 165 (at a top surface of the body contact 165 (which is aligned along the top surface of the source region 130)). The length G2 and the length G3 can be less than the length G1 of the source region 130. In some implementations, the length G1 can be more than two times greater than the length G2 and/or the length G3. In some implementations, the ratio of the length G1 to the length G2 (and/or with the length G3) can be 10:3.

FIGS. 6A through 6F are diagrams that illustrate a process of making a transistor 600 as described herein. The processing steps can be performed in an epitaxial layer 670 formed on, for example, a substrate (not shown). The steps will be discussed generally in terms of an N-type epitaxial layer, but the conductivity types can be reversed for formation in a P-type epitaxial layer. The process illustrated in connection with FIGS. 6A through 6F are directed to formation of the embodiment of, for example, FIGS. 4A and 4B. However, the processing can be modified for embodiments related to the formation of, for example, FIGS. 3A through 3D. In this implementation, the pillars, source regions, and/or channel regions can be formed using one or more angled implants.

As shown in FIG. 6A, trenches 614A, 614B are formed in a semiconductor region 602 (e.g., the epitaxial layer 670 of a semiconductor region) of a semiconductor. A mesa 620 is defined along with the formation of the trenches 614A, 614B. The sidewalls of the trenches 614A, 614B and a top of the mesa 620 are lined with a dielectric layer 604 (e.g., a silicon dioxide layer). Electrodes 610A, 610B are formed within the respective trenches 614A, 614B using, for example, a polysilicon material. The electrodes 610A, 610B can be recessed relative to a top surface of the mesa 120.

Figure 6F:
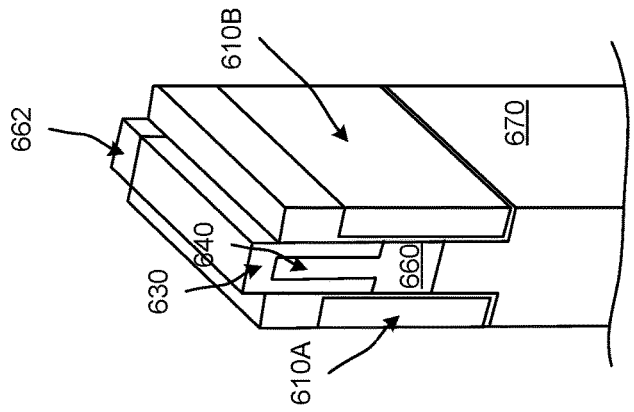

After formation of the dielectric layer 604, a P-type implant process (e.g., a 2-sided Boron implant at 30 degrees) can be performed (depicted by arrows P1) as shown in FIG. 6B, to form a P-type region that can at least, in part, form a body region 660. In some implementations, the implant process can include a 3-step implant process. In some implementations, the 3-step implant process can include one or more 2-sided implant processes. In some implementations, two or more of the 2-sided implant processes can be performed at different energies and/or angles (e.g., 20 degrees, 55 degrees). This 3-step implant process can improve productivity and can result in the elimination of at least some later processing steps (e.g., elimination of an implant performed as described in connection with FIG. 6F).

An N-type implant process can be performed as shown in FIG. 6C to form, at least in part, a source region 630 (and a part of a pillar 640). In some implementations, the N-type implant process can include more than one N-type implant process (e.g., a 2-sided Arsenic implant at 15 degrees and a 2-sided Arsenic implant at 40 degrees). During the N-type implant process a resist 605 is applied to block an area where a body contact region (e.g., a body contact 662) will be formed. The resist 605 also blocks formation of the source region 630 below the area where the body contact region will be formed (so that the side portions of the source region 630 will be discontinuous). To form continuous side portions of the source region 630 (without discontinuities in the body contact region), the processing (e.g., N-type implant) associated FIG. 6C can be omitted from the process flow.

In some implementations, the ratio of a length of the source region and the body contact can be controlled by mask patterns to target a particular on-resistance and/or potential latch-up (bipolar device turn-on) voltage. In some implementations, a rapid thermal anneal (RTA) (e.g., a rapid thermal oxidation (RTO)) process is performed to further define the source region 630 as shown in FIG. 6D. The rapid thermal anneal can be performed at high temperature (e.g., 1000 degrees C. in oxygen (02) for 60 seconds).

Figure 6E:
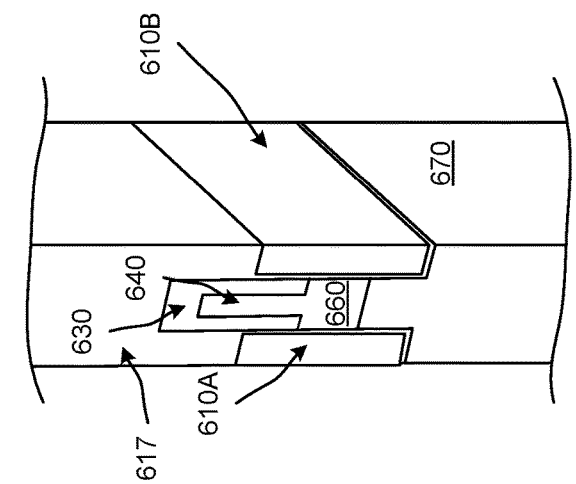
Figure 6D:
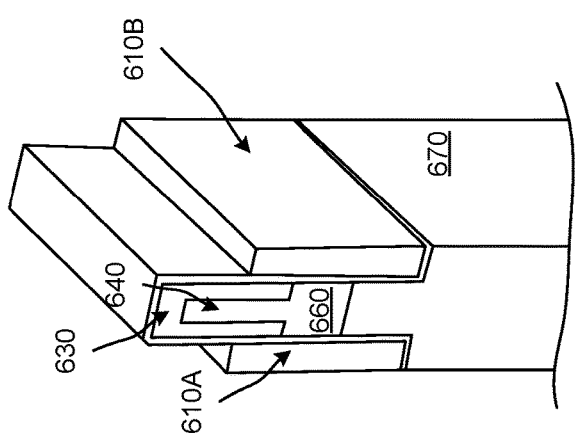

As shown in FIG. 6E, a dielectric layer 617 is formed on the device. The dielectric layer 617 can include a high temperature oxide deposition, a borophosphosilicate glass (BPSG) deposition, BPSG reflow, and/or so forth. In some implementations, the dielectric layer 617 can be recessed (e.g., etched (contact etch)), as shown in FIG. 6F, to expose a top surface of the source region 630 and the body contact 662 in preparation for a metal contact (e.g., source conductor). A blanket N-type implant (e.g., quad Arsenic implant at 7 degrees) and P-type implant (e.g., quad Boron implant at 25 degrees) are performed to further define the source region 630 and the pillar 640. In some implementations where a 3-step implant process is used in connection with the process shown in FIG. 6B, the P-type implant process can be removed (e.g., not performed) in connection with FIG. 6F. Accordingly, the P-type implant process can be performed before the contact etch instead of after the contact etch. Although not shown, a photo and an implant process can be performed to heavily dope the body contact 662 as a body contact.

Figure 7:
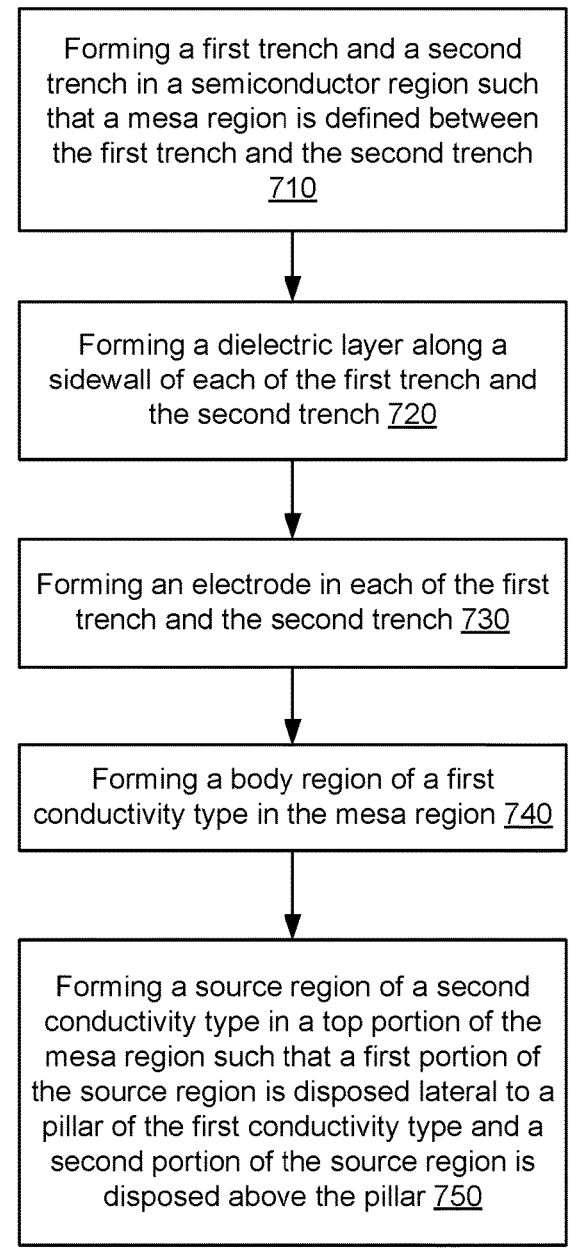
FIG. 7 is a flowchart illustrating a method of forming a transistor, according to an implementation.

FIG. 7 is a flowchart illustrating a method of forming a transistor, according to an implementation. The flowchart illustrated in FIG. 7 can be used to form (e.g., manufacture) one or more of the transistor implementations described herein.

The method can include forming a first trench and a second trench in a semiconductor region such that a mesa region is defined between the first trench and the second trench (block 710). In some implementations, the mesa region can be less than a micron in width.

A dielectric layer can be formed along a sidewall of each of the first trench and the second trench (block 720), and an electrode can be formed in each of the first trench and the second trench (block 730). The electrode can be a gate electrode and can include, for example, a polysilicon material.

A body region of a first conductivity type is formed in the mesa region (block 740). The body region can be formed in an epitaxial layer on a substrate. The epitaxial layer can have a second conductivity type opposite the first conductivity type.

A source region of a second conductivity type is formed in a top portion of the mesa region such that a first portion of the source region is disposed lateral to a pillar of a first conductivity type and a second portion of the source region is disposed above the pillar (block 750). The first portion can be a side portion of the source region. The second portion can be a top portion of the source region. In some implementations, the pillar and the source region can have a profile similar to that shown in, for example, FIG. 1A.

The method can also include forming a body region, using an implant process, along a portion of the mesa such that body contact region is formed. In some implementations, the body region in the body contact region can have a cross-sectional profile similar to those shown in, for example, FIGS. 1B, 1C, 1E, and/or 1F. The method can also include blocking an implant during the formation of the source region such that the first portion of the source region has a discontinuity in a body contact region such as that shown in, for example, FIGS. 4A and 4B. In some implementations, the source region can be formed so that the first region of the source region is continuous such as that shown in, for example, FIGS. 3A through 3D.

Figure 8:
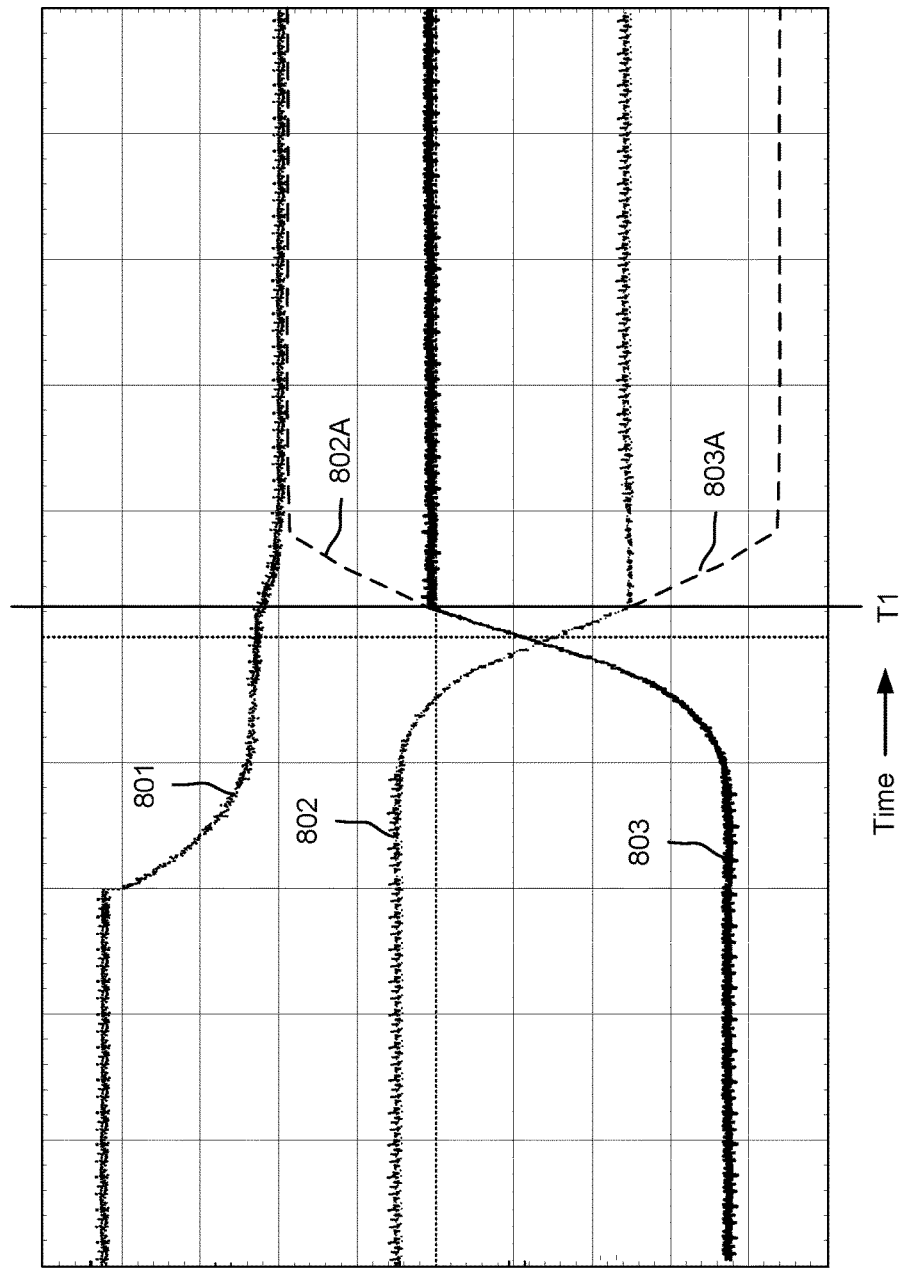
FIG. 8 is a graph that illustrates a latch-up scenario of a transistor.

FIG. 8 is a graph that illustrates a latch-up scenario of a transistor. As shown in FIG. 8, as a gate voltage 801 (in V/div) and a transistor current 802 (in A/div) decreases over time, a source voltage 803 increases. However, at approximately time T1, the source voltage 803 (in V/div) does not continue to an expected source voltage 803A (shown with a dashed line) when the transistor is off, and the transistor current 802 does not continue to an expected transistor current of 0 when the transistor is off (also shown with a dashed line). The latch-up condition prevents the source voltage 803 from achieving the expected source voltage 803A and the transistor current 802 from continuing to an expected transistor current of 0 when the transistor is off.

Figure 9:
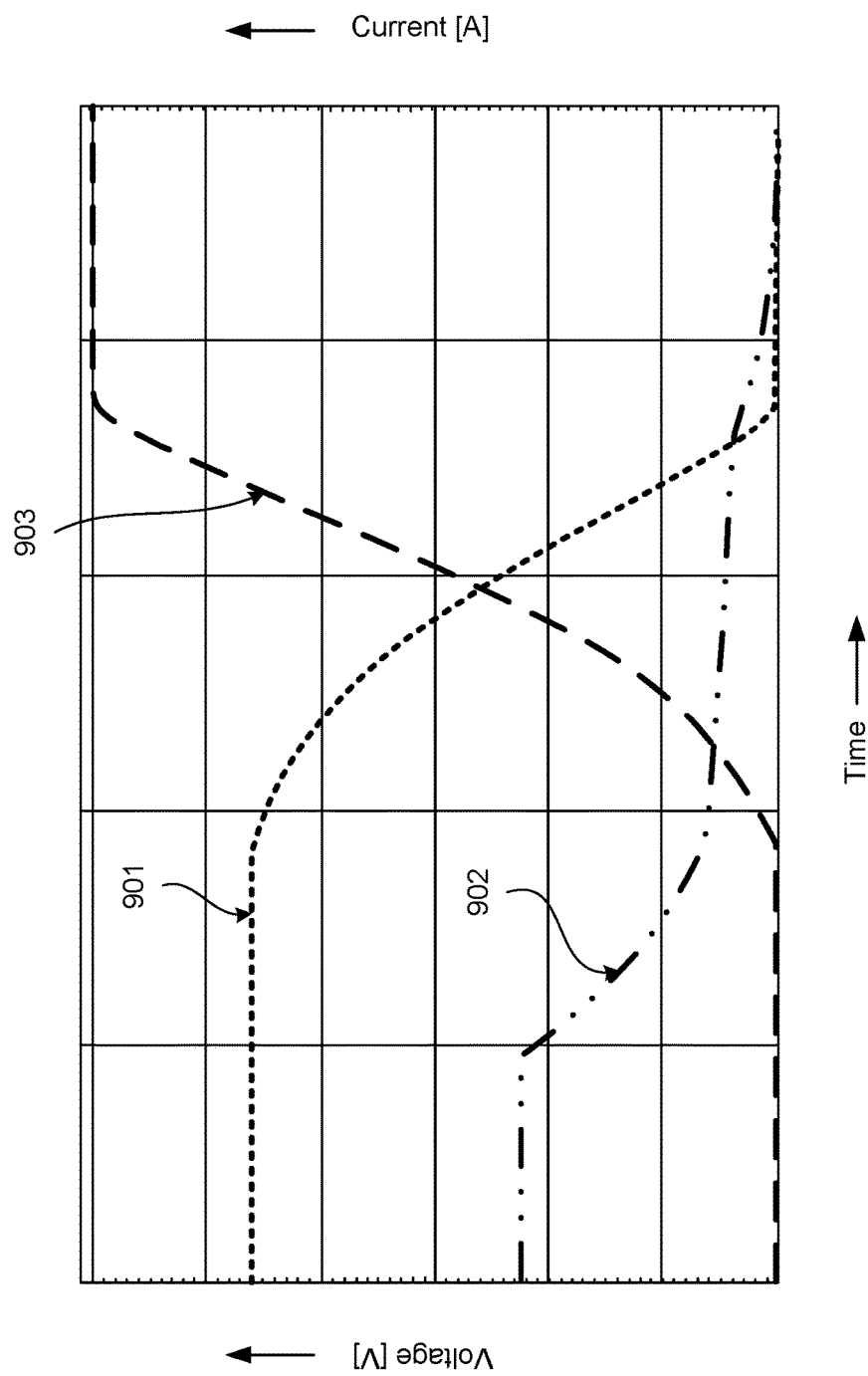
FIG. 9 is a graph that illustrates operation of a transistor, in accordance with the implementations described herein.

FIG. 9 is a graph that illustrates operation of a transistor in accordance with the implementations described herein. As shown in FIG. 9, as gate voltage 902 decreases, a drain voltage 903 rises as expected and a drain current 901 decreases to zero.

Figure 10:
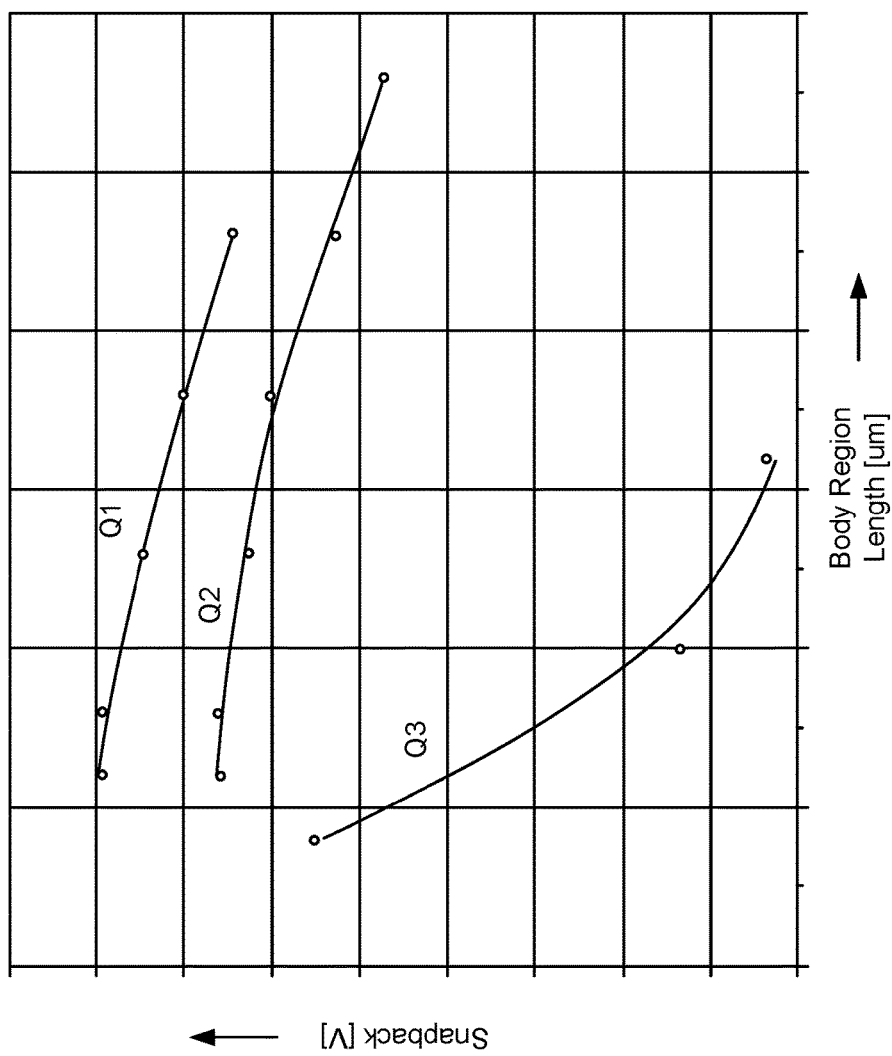
FIG. 10 is a graph that illustrates body contact length versus snapback voltage for various pillar cell pitches.

FIG. 10 is a graph that illustrates body contact length versus snapback voltage for various pillar cell pitches. The pillar cell pitch can be the distance between pillars included in adjacent mesas. FIG. 10 is a graph that illustrates that even with increasing body contact length (e.g., body contact length H2 shown in FIG. 4B), the likelihood of latch-up (illustrated as snapback voltage) can be decreased. This graph illustrates a pillar cell pitch of Q1, a pillar cell pitch of Q2, and a pillar cell pitch of Q3 where Q1>Q2>Q3. The likelihood of latch-up can be decreased with relatively little on-resistance penalty.

Figure 11:
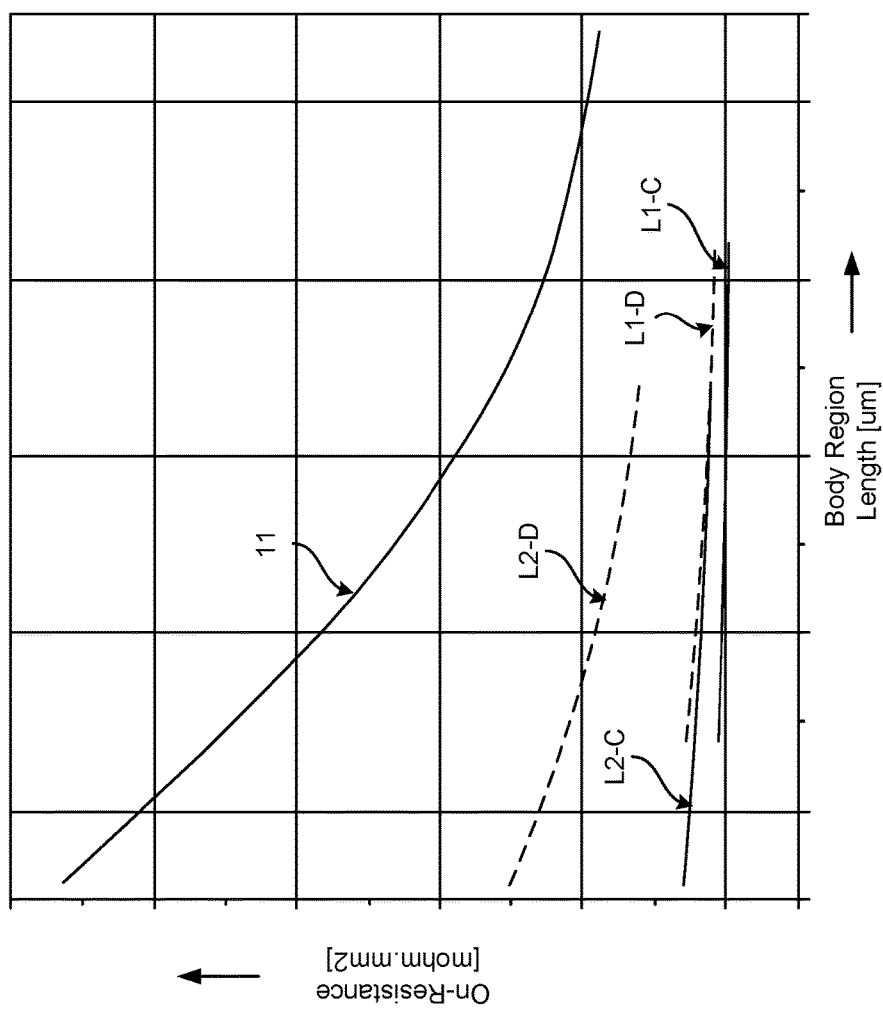
FIG. 11 illustrates on-resistance versus body contact length for various devices.

FIG. 11 illustrates on-resistance versus body contact length for various devices. Curve 1101 is associated with a conventional transistor, and curves L1-C, L1-D, L2-C, and L2-D are associated with transistors based on the implementations described herein. Curves L1-C and L1-D are transistors with a body contact length of L1, and curves L2-C and L2-D are transistors with a body contact length of L2 (where L2=2*L1). The curves L1-C and L2-C are blanket implant devices (with continuous side portion in the source region), and the curves L1-D and L2-D are patterned implant devices (with dis-continuous side portion in the source region). The on-resistance is relatively low for the transistors based on the concepts described herein as compared with the conventional transistor. For a particular body contact length, the transistors that are continuous (L1-C, L2-C) have a more desirable on-resistance than transistors with discontinuities (L1-D, L2-D).

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus, comprising:
    a first trench disposed in a semiconductor region and including a gate electrode;
    a second trench disposed in the semiconductor region;
    a mesa region disposed between the first trench and the second trench;
    a source region of a first conductivity type disposed in a top portion of the mesa region;
    an epitaxial layer of the first conductivity type;
    a body region of a second conductivity type disposed in the mesa region and disposed between the source region and the epitaxial layer of the first conductivity type, the second conductivity type being different than the first conductivity type; and
    a pillar of the second conductivity type disposed in the mesa region such that a first portion of the source region is disposed lateral to, and in contact with the pillar, and a second portion of the source region is disposed above, and in contact with the pillar.

2. The apparatus of claim 1, wherein the pillar is aligned along a vertical axis, the vertical axis intersects the second portion of the source region, the pillar, and the body region.

3. The apparatus of claim 1, wherein the source region includes a third portion, the pillar is disposed between the first portion of the source region and the second portion of the source region.

4. The apparatus of claim 1, wherein the mesa has a first width and the pillar has a second width, the second width being approximately half of the first width.

5. The apparatus of claim 1, further comprising:
    a source conductor in contact with the source region and defining an Ohmic contact.

6. The apparatus of claim 1, wherein the mesa region has a length aligned along a longitudinal axis orthogonal to a vertical axis along a height of the mesa region and orthogonal to a width of the mesa region,
    the pillar of the second conductivity type, the first portion of the source region, and the second portion of the source region intersect a first cross-sectional plane at a first location along the length of the mesa region,
    the pillar is in contact with a body contact at a second cross-sectional plane at a second location along the length of the mesa region.

7. The apparatus of claim 6, wherein the pillar is disposed vertically between the body region and the body contact.

8. The apparatus of claim 6, wherein the body contact has a width equal to the width of the mesa region.

9. The apparatus of claim 1, wherein the mesa region has a length aligned along a longitudinal axis orthogonal to a vertical axis along a height of the mesa region and orthogonal to a width of the mesa region,
    the first portion of the source region is discontinuous along the length of the mesa region.

10. The apparatus of claim 1, wherein the mesa region has a length aligned along a longitudinal axis orthogonal to a vertical axis along a height of the mesa region and orthogonal to a width of the mesa region,
    the first portion of the source region has a discontinuity at a body contact along the length of the mesa region.

11. The apparatus of claim 10, wherein the second portion of the source region is continuous along a length of the mesa region below the discontinuity of the first portion of the source region at the body contact.

12. The apparatus of claim 1, further comprising:
    a source conductor in contact with the source region;
    a drain conductor; and
    a substrate in contact with the epitaxial layer and disposed between the source conductor and the drain conductor.

13. The apparatus of claim 1, wherein the mesa region has a top surface disposed above a top surface of the electrode disposed in the first trench.

14. An apparatus, comprising:
    a first trench disposed in a semiconductor region and including a gate electrode;
    a second trench disposed in the semiconductor region;
    a mesa region disposed between the first trench and the second trench;
    a source region of a first conductivity type disposed in a top portion of the mesa region; and
    an epitaxial layer of the first conductivity type, the mesa region including a first region of a second
conductivity type at a first cross-section along the mesa
region and a second region of the second conductivity
type at a second cross-section along the mesa region,
the second conductivity type being different than the
first conductivity type, the first region of the second conductivity type having a
different shape than the second region of the second
conductivity type, both the first region of the second conductivity type and
the second region of the conductivity type having a
pillar portion and a body region below the pillar
portion, the first region including a body contact above the pillar
portion.

15. The apparatus of claim 14, wherein the body contact is excluded from the second region.

16. The apparatus of claim 14, wherein the first region of the second conductivity type has a surface area greater than a surface area of the second region of the second conductivity type.

17. The apparatus of claim 14, wherein the body contact has a bottom portion with a length that is less than a length of a top portion of the body contact.

18. A method, comprising:
forming a first trench and a second trench in a semiconductor region such that a mesa region is defined between the first trench and the second trench;
forming a dielectric layer along a sidewall of each of the first trench and the second trench;
forming an electrode in each of the first trench and the second trench;
forming a body region of a first conductivity type in the mesa region; and
forming a source region of a second conductivity type in a top portion of the mesa region such that a first portion of the source region is disposed lateral to, and in contact with a pillar of a first conductivity type, and a second portion of the source region is disposed above, and in contact with the pillar, the second conductivity type being different than the first conductivity type.

19. The method of claim 18, further comprising:
forming a body contact, using an implant process, along a portion of the mesa.

20. The method of claim 18, further comprising:
blocking an implant during the formation of the source region such that the first portion of the source region has a discontinuity in a body contact region.

\* \* \* \* \*